(12) United States Patent
Doerr et al.

(10) Patent No.: US 10,578,799 B2
(45) Date of Patent: Mar. 3, 2020

(54) CO-PACKAGING PHOTONIC INTEGRATED CIRCUITS AND APPLICATION SPECIFIC INTEGRATED CIRCUITS

(71) Applicant: Acacia Communications, Inc., Maynard, MA (US)

(72) Inventors: Christopher Doerr, Middletown, NJ (US); Eric Swanson, Gloucester, MA (US); Diedrik Vermeulen, Somerville, MA (US); Saeid Azemati, Newton, MA (US); Jon Stahl, Wayland, MA (US)

(73) Assignee: Acaia Communications, Maynard, MA (US)

( * ) Notice: Subject to any disclaimer, the term of this patent is extended or adjusted under 35 U.S.C. 154(b) by 0 days.

(21) Appl. No.: 15/870,468

(22) Filed: Jan. 12, 2018

(65) Prior Publication Data

US 2018/0203187 A1    Jul. 19, 2018

Related U.S. Application Data

(63) Continuation of application No. 13/871,331, filed on Apr. 26, 2013, now Pat. No. 9,874,688.

(60) Provisional application No. 61/638,658, filed on Apr. 26, 2012.

(51) Int. Cl.
*G02B 6/12* (2006.01)
*G02B 6/10* (2006.01)
*G02B 6/42* (2006.01)

(52) U.S. Cl.
CPC .............. *G02B 6/12* (2013.01); *G02B 6/428* (2013.01); *G02B 6/4269* (2013.01)

(58) Field of Classification Search
CPC ........ G02B 6/12; G02B 6/12004; G02B 6/43; G02B 6/122; G02B 6/428; G02B 6/02309
USPC .............................. 385/14, 15, 37; 250/214.1
See application file for complete search history.

(56) References Cited

U.S. PATENT DOCUMENTS

| | | | |
|---|---|---|---|
| 4,776,661 A | 10/1988 | Handa |
| 4,869,568 A | 9/1989 | Schimpe |
| 5,146,518 A | 9/1992 | Mak et al. |
| 5,208,800 A | 5/1993 | Isobe et al. |
| 5,420,947 A | 5/1995 | Li et al. |
| 5,469,526 A | 11/1995 | Rawlings |
| 5,581,642 A | 12/1996 | Deacon et al. |
| 5,664,032 A | 9/1997 | Bischel et al. |

(Continued)

FOREIGN PATENT DOCUMENTS

| | | |
|---|---|---|
| JP | 2012-252135 A | 12/2012 |
| WO | WO 96/10265 A1 | 4/1996 |

OTHER PUBLICATIONS

International Search Report and Written Opinion dated Mar. 17, 2016 for Application No. PCT/US2015/058070.

(Continued)

*Primary Examiner* — Kaveh C Kianni
*Assistant Examiner* — Hung Q Lam
(74) *Attorney, Agent, or Firm* — Joseph D'Angelo

(57) ABSTRACT

Disclosed herein are designs, structures and techniques for advanced packaging of multi-function photonic integrated circuits that allow such high-performance multi-function photonic integrated circuits to be co-packaged with a high-performance multi-function ASIC thereby significantly reducing strenuous interconnect challenges and lowering costs, power and size of the overall devices.

20 Claims, 26 Drawing Sheets

(56) References Cited

U.S. PATENT DOCUMENTS

| | | | |
|---|---|---|---|
| 5,790,730 A | 8/1998 | Kravitz et al. |
| 5,943,461 A | 8/1999 | Shahid |
| 6,058,235 A | 5/2000 | Hiramatsu et al. |
| 6,198,860 B1 | 3/2001 | Johnson et al. |
| 6,224,268 B1 | 5/2001 | Maiming et al. |
| 6,259,841 B1 | 7/2001 | Bhagavatula |
| 6,263,143 B1 | 7/2001 | Potteiger et al. |
| 6,310,991 B1 | 10/2001 | Koops et al. |
| 6,320,257 B1 | 11/2001 | Jayaraj et al. |
| 6,445,939 B1 | 9/2002 | Swanson et al. |
| 6,459,842 B1 | 10/2002 | Arsenault et al. |
| 6,503,336 B1 | 1/2003 | Barr |
| 6,542,682 B2 | 4/2003 | Cotteverte et al. |
| 6,567,963 B1 | 5/2003 | Trezza |
| 6,601,998 B2 | 8/2003 | Arsenault et al. |
| 6,640,034 B1 | 10/2003 | Charlton et al. |
| 6,690,845 B1 | 2/2004 | Yoshimura et al. |
| 6,788,834 B2 | 9/2004 | Pokrovski et al. |
| 6,811,326 B2 | 11/2004 | Keeble et al. |
| 6,822,465 B1 | 11/2004 | Babcock et al. |
| 6,945,712 B1 | 9/2005 | Conn |
| 6,976,795 B2 | 12/2005 | Go et al. |
| 7,006,732 B2 | 2/2006 | Gunn et al. |
| 7,058,247 B2 | 6/2006 | Crow et al. |
| 7,065,272 B2 | 6/2006 | Taillaert et al. |
| 7,118,294 B2 | 10/2006 | Hamasaki et al. |
| 7,298,945 B2 | 11/2007 | Gunn, III et al. |
| 7,327,022 B2 | 2/2008 | Claydon et al. |
| 7,362,934 B2 | 4/2008 | Hamano |
| 7,473,038 B2 | 1/2009 | Fujiwara et al. |
| 7,785,020 B2 | 8/2010 | Kim et al. |
| 8,021,057 B2 | 9/2011 | Tamura et al. |
| 8,058,137 B1 | 11/2011 | Or-Bach et al. |
| 8,064,739 B2 | 11/2011 | Binkert et al. |
| 8,290,008 B2 | 10/2012 | Andry et al. |
| 8,550,724 B2 | 10/2013 | Oki |
| 8,654,440 B2 | 2/2014 | Nakagawa |
| 8,655,183 B2 | 2/2014 | Ho et al. |
| 8,821,039 B2 | 9/2014 | Matsui et al. |
| 8,824,837 B2 | 9/2014 | Ren et al. |
| 9,557,478 B2 | 1/2017 | Doerr et al. |
| 9,874,688 B2 | 1/2018 | Doerr et al. |
| 2002/0028045 A1 | 3/2002 | Yoshimura et al. |
| 2002/0081087 A1 | 6/2002 | Chen et al. |
| 2002/0136506 A1 | 9/2002 | Asada et al. |
| 2002/0168147 A1 | 11/2002 | Case et al. |
| 2003/0044127 A1 | 3/2003 | Roth et al. |
| 2003/0103755 A1 | 6/2003 | Meyer |
| 2003/0117770 A1 | 6/2003 | Montgomery et al. |
| 2003/0133686 A1 | 7/2003 | Delrosso et al. |
| 2003/0185525 A1 | 10/2003 | Lacy et al. |
| 2003/0189214 A1 | 10/2003 | Nguyen et al. |
| 2004/0036170 A1 | 2/2004 | Lee et al. |
| 2004/0048417 A1 | 3/2004 | Nguyen et al. |
| 2004/0076380 A1 | 4/2004 | Asada et al. |
| 2004/0101020 A1 | 5/2004 | Bhandarkar |
| 2005/0100294 A1 | 5/2005 | Nguyen et al. |
| 2005/0117835 A1 | 6/2005 | Nguyen et al. |
| 2005/0135732 A1 | 6/2005 | Crow et al. |
| 2005/0175294 A1 | 8/2005 | Kuu |
| 2005/0224946 A1 | 10/2005 | Dutta |
| 2005/0230795 A1 | 10/2005 | Furuyama et al. |
| 2006/0215963 A1 | 9/2006 | Hamano |
| 2006/0222303 A1 | 10/2006 | Chung et al. |
| 2006/0280410 A1 | 12/2006 | Fujiwara et al. |
| 2007/0031100 A1 | 2/2007 | Garcia et al. |
| 2007/0036335 A1 | 2/2007 | Skradde et al. |
| 2007/0241783 A1* | 10/2007 | Schmit et al. ........... 326/41 |
| 2008/0062980 A1 | 3/2008 | Sunaga et al. |
| 2008/0226228 A1 | 9/2008 | Tamura et al. |
| 2008/0247713 A1 | 10/2008 | Tamura et al. |
| 2009/0010600 A1 | 1/2009 | Kim et al. |
| 2010/0059822 A1 | 3/2010 | Pinguet et al. |
| 2010/0215317 A1 | 8/2010 | Rolston et al. |
| 2011/0044369 A1 | 2/2011 | Andry et al. |
| 2011/0058813 A1 | 3/2011 | Boyd et al. |
| 2011/0158658 A1 | 6/2011 | Myslinski et al. |
| 2012/0014639 A1 | 1/2012 | Doany et al. |
| 2012/0129301 A1 | 5/2012 | Or-Bach et al. |
| 2012/0170927 A1 | 7/2012 | Huang et al. |
| 2012/0177381 A1* | 7/2012 | Dobbelaere et al. ......... 398/139 |
| 2012/0183256 A1 | 7/2012 | Shao et al. |
| 2012/0205524 A1 | 8/2012 | Mack et al. |
| 2012/0237171 A1 | 9/2012 | Oki |
| 2012/0326290 A1* | 12/2012 | Andry et al. ................ 257/680 |
| 2013/0155642 A1 | 6/2013 | McColloch |
| 2013/0182996 A1 | 7/2013 | Shastri et al. |
| 2013/0230272 A1 | 9/2013 | Raj et al. |
| 2013/0266277 A1 | 10/2013 | Otte |
| 2013/0308898 A1 | 11/2013 | Doerr et al. |
| 2013/0336617 A1 | 12/2013 | Otte et al. |
| 2014/0010498 A1 | 1/2014 | Verslegers et al. |
| 2014/0064659 A1 | 3/2014 | Doerr et al. |
| 2014/0099061 A1 | 4/2014 | Isenhour et al. |
| 2014/0147079 A1 | 5/2014 | Doerr et al. |
| 2014/0153601 A1 | 6/2014 | Doerr et al. |
| 2014/0203175 A1* | 7/2014 | Kobrinsky et al. ........ 250/214.1 |
| 2014/0264907 A1 | 9/2014 | Altunyurt et al. |
| 2014/0286647 A1 | 9/2014 | Aayazi et al. |
| 2015/0063747 A1 | 3/2015 | Chen et al. |

OTHER PUBLICATIONS

International Preliminary Report on Patentability dated May 11, 2017 for Application No. PCT/US2015/058070.

[No Author Listed], Light On Board™ Optically Enabled BGA IC Package. Reflex Photonics. White Paper. 15 pages.

Barwicz et al., Assembly of Mechanically Compliant Interfaces between Optical Fibers and Nanophotonic Chips. The 64th Electronic Components and Technology Conference (ECIC 2014). Orlando, Florida. Presentation. May 27-30, 2014. 14 pages.

Galan et al., Low profile silicon photonics packaging approach featuring configurable multiple electrical and optical connectivity. Proceedings of the 8th IEEE International Conference on Group IV Photonics (GFP). Sep. 14-16, 2011:377-9.

Kopp et al., Silicon Photonic Circuits: On-CMOS Integration, Fiber Optical Coupling, and Packaging. IEEE J Sel Top Quant Electron. May/Jun. 2011;17(3):498-509.

Maj et al., Light on Board Technology Overview™: Implementation of High-Speed Optical Interconnects Integrated into Semiconductor Integrated Circuit (IC) Packages. Reflex Photonics, Inc. White Paper. Apr. 2006. 4 pages.

Thacker et al., Flip-Chip Integrated Silicon Photonic Bridge Chips for Sub-Picojoule Per Bit Optical Links. 2010 Electronic Components and Technology Conference. 2010:240-6.

Zheng et al., Low power silicon photonic transceivers. Photonics Society Summer Topical Meeting Series, 2010 IEEE. Jul. 19-21, 2010;199-200.

* cited by examiner

TIA and Mod Drivre
Transistors
In
Substrate

PIC
Under
ASIC

CO-PACKAGING PHOTONIC INTEGRATED CIRCUITS AND APPLICATION SPECIFIC INTEGRATED CIRCUITS

CROSS REFERENCE TO RELATED APPLICATIONS

This application is a continuation claiming the benefit of U.S. patent application Ser. No. 13/871,331, filed Apr. 26, 2013 and entitled "CO-PACKAGING PHOTONIC INTEGRATED CIRCUITS AND APPLICATION SPECIFIC INTEGRATED CIRCUITS," which is hereby incorporated herein by reference in its entirety. U.S. patent application Ser. No. 13/871,331 claims the benefit of U.S. Provisional Patent Application Ser. No. 61/638,658 filed Apr. 26, 2012 which is incorporated by reference in its entirety as if set forth at length herein.

TECHNICAL FIELD

This disclosure relates generally to the field of photonic integrated circuits (PICs) and application specific integrated circuits (ASICs). More particularly, it pertains to techniques, methods and apparatus for co-packaging PICs with ASICs.

BACKGROUND

Contemporary optical communications and other systems oftentimes employ photonic integrated circuits and application specific integrated circuits to enhance these optical systems. Interconnecting the PICs with the ASICs oftentimes presents significant interconnection problems. According, methods, structures or techniques that address such problems represent a welcome addition to the art.

SUMMARY

An advance in the art is made according to an aspect of the present disclosure directed to methods, structures and techniques for interconnecting photonic integrated circuits to application specific integrated circuits and the co-packaging thereof.

Viewed from a first aspect, the present disclosure is directed to a co-packaging arrangement for a photonic integrated circuit (PIC) and an application specific integrated circuit (ASIC) wherein the PIC and the ASIC positioned within a single shared housing and the PIC includes at least two optical fibers that couple light between structures outside the housing to optical waveguides on the PIC, wherein said PIC includes optical modulators and optical detectors and the shared housing includes electrical interconnects for interconnecting the PIC to the ASIC.

Viewed from another aspect, the present disclosure is directed to a photonic integrated circuit co-packaged with an ASIC, wherein the PIC includes at least two fibers that couple light between outside the package to optical waveguides on the PIC, where the PIC has optical modulators and optical detectors and the ASIC is flip chip mounted and die bonded to a common substrate that has ball bonds to bond the package to an external circuit board. The PIC and the ASIC are die-bonded to the common substrate.

Viewed from still another aspect, the present disclosure is directed to a photonic integrated circuit co-packaged with an ASIC where the ASIC is flip-chip mounted to allow heat to be coupled out a back side of the package wherein the PIC includes at least two fibers that couple light from outside the package with optical waveguides on the PIC where the PIC serves as a substrate to the ASIC.

Viewed from yet another aspect, the present disclosure is directed to a photonic integrated circuit co-packaged with an ASIC on a common substrate where the photonic integrated circuit is sufficiently thin such that both top and bottom sides are accessible.

Viewed from still another aspect, the present disclosure is directed to a technique for out-of-plane fiber coupling to a photonic integrated circuit wherein the PIC includes a wrap-around carrier thereby permitting the positional plane of the PIC to be substantially perpendicular to the surface of a mounting substrate.

Viewed from one more aspect, the present disclosure is directed to a photonic integrated circuit co-packaged with at least one fiber attachment and including through-silicon-vias (TSVs) to die bonds located on a bottom of the PIC whereby the diebonds connect to and ASIC that is flip-chip mounted and that ASIC includes TSVs to pads that attach to diebonds on a PIC. The ASIC is further die or ball bonded to a package substrate.

BRIEF DESCRIPTION OF THE DRAWING

A more complete understanding of the present disclosure may be realized by reference to the accompanying drawings in which.

DETAILED DESCRIPTION

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently-known equivalents as well as equivalents developed in the future, i.e., any elements developed that perform the same function, regardless of structure.

Thus, for example, it will be appreciated by those skilled in the art that the diagrams herein represent conceptual views of illustrative structures embodying the principles of the invention.

In addition, it will be appreciated by those skilled in art that any flow charts, flow diagrams, state transition diagrams, pseudocode, and the like represent various processes which may be substantially represented in computer readable medium and so executed by a computer or processor, whether or not such computer or processor is explicitly shown.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein. Finally, and unless otherwise explicitly specified herein, the drawings are not drawn to scale.

Thus, for example, it will be appreciated by those skilled in the art that the diagrams herein represent conceptual views of illustrative structures embodying the principles of the disclosure.

Figure 1A:
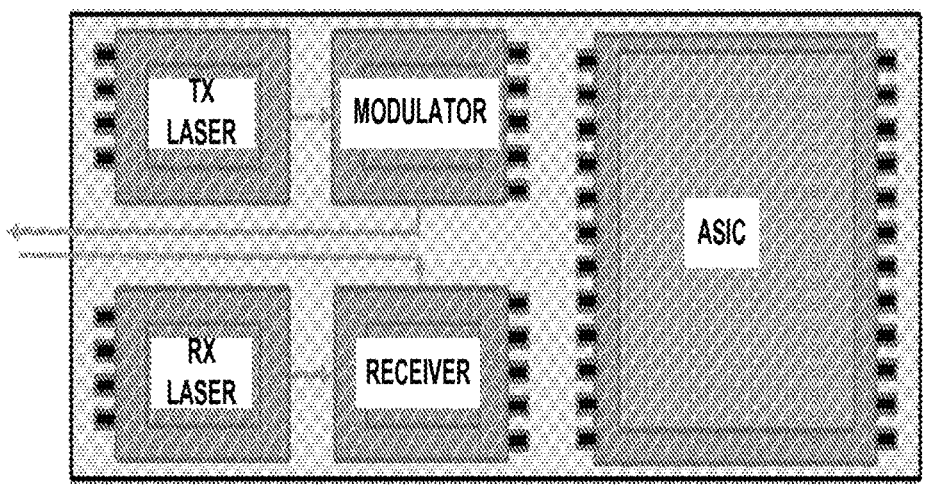
FIG. 1(A) shows a schematic configuration of contemporary fiber optic transceiver.

By way of some additional background and with initial reference to FIG. 1(A), it is noted that contemporary, state-of-the-art commercial optical transponders often include an input fiber that receives light from an optical system and an output fiber that outputs (transmits) light back to the optical system. In this disclosure we assume that such a system is a fiber optic communication network but those skilled in the art will recognize that this disclosure is applicable to many other systems utilizing optical signals including biomedical imaging equipment, laser ranging systems, etc.

Referring again to FIG. 1(A), it may be observed that within a transponder there are often individually packaged optical components such as transmitter lasers, receiver lasers, modulators, as well as other receivers that are housed in individual opto-electro-mechanical modules. These modules are then interconnected via fiber splices or free-space optics and placed on one or more high speed circuit boards with low-speed and high-speed electrical interconnects including connections to one or more complex analog and/or digital signal processing circuits such as ASICs.

Notably, in this description we sometimes refer to a device that contains analog and/or digital signal processing functions as an ASIC. Notwithstanding this reference, it is understood by those in the art that this may represent one or more electronic chips including ASICs and field programmable gate arrays (FPGAs) and other types of electronic circuits.

Additionally, and with continued reference to FIG. 1(A), shown therein are one or more leads on the side of the ASIC package. Those skilled in the art will readily appreciate that such leads may be edge leads as indicated (and located on the edge of the ASIC package) or they may be ball bonds located on the bottom of the ASIC package as is oftentimes the case with contemporary packages. Accordingly, while we may show and describe such edge leads throughout this disclosure, it is understood that ball or die bonds can be used equally well and are often preferred because of the large number of connections and the low parasitic electrical effects associated with ball bonds. With these foundational principles in place, those skilled in the art will of course appreciate that contemporaneous, state of the art devices as depicted in FIG. 1(A) are large, costly, and may be accurately described as a high-power dissipation modules.

Figure 1B:
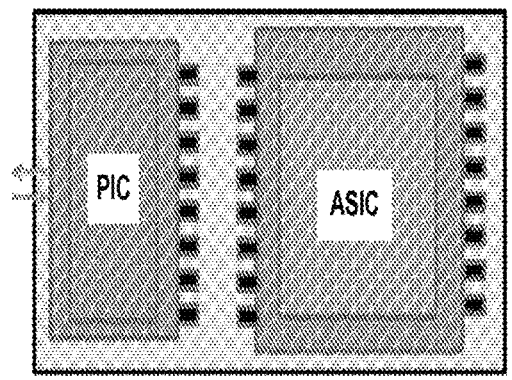
FIG. 1(B) shows a schematic configuration of possible fiber optic transceiver.

Turning now to FIG. 1(B), an integrated device according to the present disclosure is depicted in schematic form. More particularly, components such as laser, modulator, receiver, etc are be integrated in one or more photonic integrated circuits (PICs) that are similarly housed in a high speed electro-optical-mechanical package that is positioned on a circuit board and connected to an ASIC. As readily appreciated, approaches according to the present disclosure such as that depicted in FIG. 1(B) should result in lower size, cost, and power than that contemporary devices as depicted in FIG. 1(A).

Figure 1C:
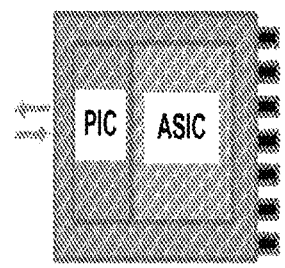
FIG. 1(C) shows a schematic configuration of a fiber optic transceiver according to an aspect of the present disclosure.

As noted previously, one aspect of the present disclosure—as depicted in FIG. 1(C)—is an advanced package structure and associated methods and techniques that permit a bare silicon PIC (or other photonics material other than silicon such as InP or GaAs) to be co-located along with an ASIC within a common high speed opto-electro-mechanical package thereby lowering cost, power and size.

Figure 2:
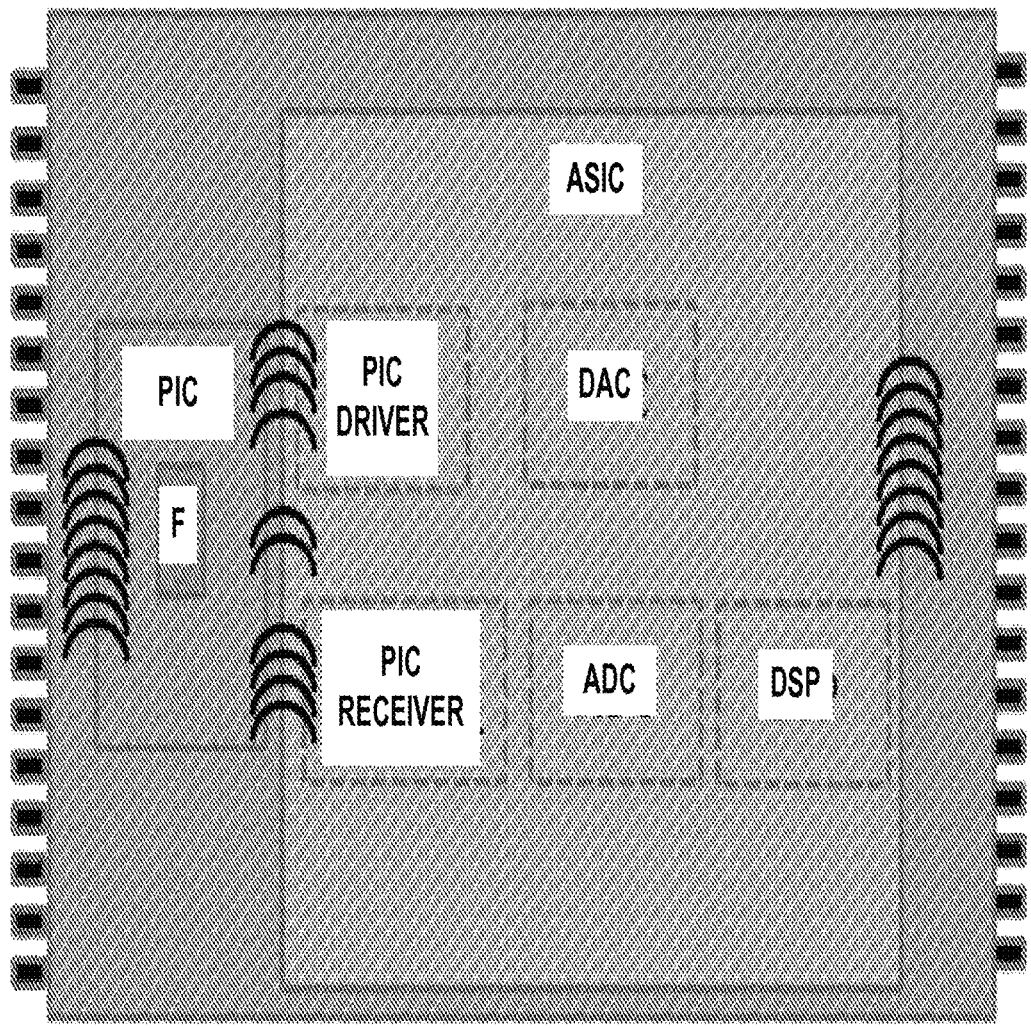
FIG. 2 shows a cross-sectional schematic configuration of an opto-electro-mechanical package including a PIC and ASIC.

Turning now to FIG. 2, there it shows a schematic of an opto-electro-mechanical package containing both a PIC and an ASIC according to an aspect of the present disclosure. In one exemplary embodiment of a package according to the present disclosure, the PIC contains few electronic components and most, or all of such electronic processing elements are located on the ASIC which may advantageously be a CMOS ASIC or another type of ASIC known in the art.

One benefit of this approach according to the present disclosure is that a simpler, lower cost processing can be employed in the design and manufacture of the PIC chip than prior-art approaches that require the mixing and integration of complex electronic elements and optical elements.

In one preferred embodiment that exhibits low power consumption, a DAC is advantageously used to directly drive the optical amplifier on the PIC with no intermediate PIC Driver amplifier.

Alternatively if higher power characteristics are tolerable then a PIC Driver amplifier stage can be used. In one embodiment, requisite transimpedance amplifiers (TIAs) and optical modulator drivers are located on the ASIC—which may be a mixed signal CMOS ASIC containing a PIC receiver which in turn may be one or more TIAs followed by analog to digital converters (ADCs) or other receiver structures. Optionally, the ASIC may optionally contain high-power, high-speed PIC Drivers which in turn may include several driver amplifier stages. This driver stage can be driven, in preferred embodiments, by one more morel digital to analog converters (DACs).

The PIC optical modulation may optionally be directly driven from a DAC with no need for a PIC Driver stage and no PIC electronic amplifier circuitry. Such a configuration may advantageously lessen the power requirements of the overall system.

With continued reference to FIG. 2, some or all of the high and low speed electrical connections between the PIC and ASIC may be along one common edge between the PIC and ASIC such that the lead lengths can be very short and have low parasitic electrical effects.

In another embodiment, short wire bonds can be used to interconnect the PIC and ASIC. In yet another embodiment, there is not need to have the PIC I/O along one edge and there are through-silicon-vias (TSVs) or other approaches to getting high speed interconnections between the PIC and the ASIC as will be more fully described later. Notably, on the edge of the package shown in FIG. 2 are all of the high speed, low speed, power, and ground connections for electrically connecting with the PIC and ASIC. Also shown in the center of the PIC is an optical connection to facilitate light to enter into and out of the PIC.

Note that in yet another embodiment the TIA may be used as a PIC receiver and can be located on the ASIC and the photodetector located on the PIC wherein short electrical interconnections between the two are used.

As may now be readily appreciated, there are a variety of PIC structures that are suitable packaging according to aspects of the present disclosure. More particularly, and with reference now to FIG. 3, there is shown a simplified example of one such suitable PIC that may be part of a coherent optical detection system.

Figure 3:
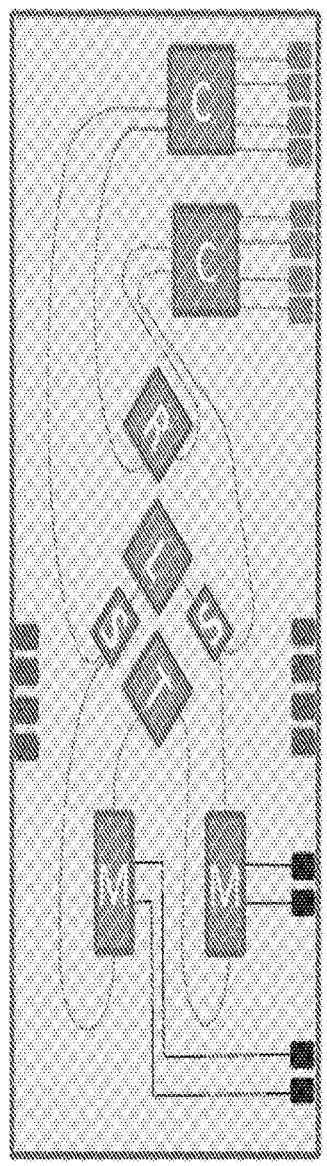
FIG. 3 shows a schematic configuration of an exemplary PIC.

In the particular exemplary embodiment shown in FIG. 3, a single master laser (not specifically shown) is located off chip and is coupled to the PIC at coupler L. As may be understood, L may be an out-of-plane coupler or other fiber to chip coupling option as is known in the art. Examples of such out-of-plane couplers include diffractive structures such as a grating waveguide couplers or a tilted mirror using—for example—total internal reflection. An example of such structure is a perfectly vertical grating coupler where the optical fiber is orthogonal to the integration plane.

Notably, other alternative embodiments may advantageously employ a horizontal "in plane" coupler such as butt coupling to the edge of the PIC. In such cases where a horizontal grating coupler is used, a polarization maintaining fiber may be used such that the two output waveguide arms from L are equally split in power.

As may be understood with continued reference to FIG. 3, 1×2 splitters S split light at a desired splitting ratio into which it is directed to receiver couplers C and transmitter modulators M. The receiver couplers can be a variety of types of couplers including multi-mode interference couplers that produce differential I/Q output signals.

The fiber from the received optical terminal is coupled into coupler R which splits the two polarizations of the light into each of two receiver couplers C. Couplers C act so as to produce two sets of differential in-phase and quadrature-phase (I/Q) output signals that are subsequently directed to photodetectors. Although only 4 photodetectors are shown for each coupler C, those skilled in the art will readily appreciate that any suitable number between 1 and 4 (or more) photodetetors may be used for each coupler C—as specific needs dictate. Finally, light from the second arm of splitter S is directed to modulators M. Appreciably, there are many types of modulators that can be used including phase modulators, intensity modulators made from silicon depletion or other techniques so as to modulator the light in simple forms such as on/off keying or more complex forms such as DP-QPSK or DP-QAM techniques. The outputs of the two modulators are combined by a polarization beam combiner or other type of beam combiner in combiner T.

Shown further in FIG. 3 are various electronic connections into the PIC for things such as monitor photo diodes, thermo-optic phase shifters, modulator bias controllers, laser bias current, photodetector bias voltages, etc that are not shown but known in the art. These connections are made at various pad locations conceptually shown as bonding pads and are then electrically routed (not shown) to the appropriate optical devices.

High speed modulator electrical input connections are shown connected to modulators, M. High-speed photodetector output connections are shown connected to couplers, C.

Those skilled in the art will appreciate and understand that there are many types of alternative PIC structures to that shown in FIG. 3—suitable for fiber optic communications. By way of example only and in no way limiting, embodiments may include laser within the PIC structure and such devices may be made by wafer bonding of a III-V semiconductor wherein said III-V semiconductor device is optically pumped by a laser located off of the PIC, or may be electrically pumped within the PIC. Additionally, alternative materials such as Germanium may be used as a gain medium within the silicon.

One advantage of the approach shown schematically in FIG. 3 is that it lessens any strenuous thermal conditions experienced in a PIC that is located in close proximity to a high power dissipation ASIC. More particularly, in such configurations a master laser may be positioned external to the PIC and only passive optical components are positioned on the PIC. As may be appreciated, such a configuration greatly mitigates any thermal complications and advantageously obviates the need for such things as thermal electrical coolers inside the opto-electro-mechanical package.

One additional feature associated with a PIC such as that depicted in FIG. 3. is that all the high speed and possibly, low-speed electrical connections that necessarily interconnect the PIC and the ASIC are located primarily along one edge so as to allow easy interconnection to the ASIC (see, e.g., FIG. 2). Also, the PIC may be designed such that optical components are appropriately configured to allow minimal optical and electrical waveguide crossings.

Finally, it is noted that in some embodiments such as those that are wire bonded, it is advantageous to position high speed I/O connections along one edge.

Figure 4:
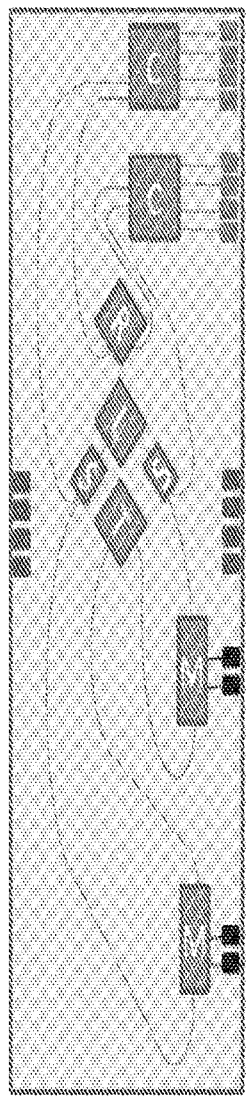
FIG. 4 shows a schematic block diagram of an exemplary PIC having high speed Input/Output on the PIC and edge of the PIC.

FIG. 4 shows another exemplary embodiment of a PIC according to an aspect of the present disclosure. In this exemplary embodiment, the high-speed electrical traces on the PIC are minimized by locating various optical functions close to the edge of the PIC.

In another alternative to the embodiment shown in FIG. 4, there are positioned few horizontal traces along the surface of the PIC and through-silicon-vias (TSVs) are used to route the high speed signal(s) to the bottom portion of the PIC and onto a passive or active substrate circuit via die ball bonds or other suitable interconnect mechanisms.

It is noted that the opto-electro-mechanical package preferably has optical input and output connections between the outside environment to the package and the PIC itself. Of course, there exist a wide variety of different types of PICs as well as a wide variety of different ways to couple light into and out of the PIC.

According to but one aspect of the present disclosure, a PIC has few or no electronic amplifying elements and contains mainly passive optical devices, an optical modulator, and photodetectors such as those illustrated schematically in FIG. 3. With additional reference to that FIG. 3, it may be observed that light is coupled into the PIC from an external laser at coupler L (which could be a horizontal grating coupler). Light from the optical network (not specifically shown) is also input into the PIC at coupler R and output from the PIC to the optical network from coupler T.

Figure 5:
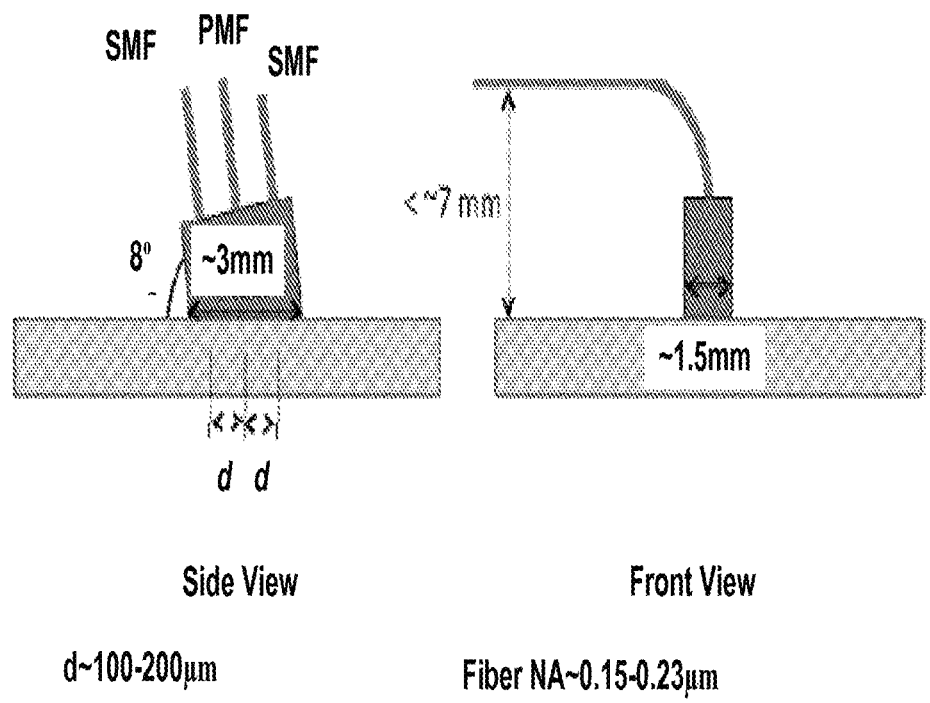
FIG. 5 shows in schematic form an exemplary three fiber block assembly for butt coupling light from optical fibers into/out of a PIC according to an aspect of the present disclosure.

As may be appreciated, there are a number of ways to get light from fibers to these three couplers. One approach is shown schematically in FIG. 5. More specifically, and as shown in FIG. 5, there are three single mode fibers, one of which is optionally a polarization maintaining (PM) fiber. These three fibers are contained in a small optical v-grooved block that is angled at approximately 8 degrees so as to couple into the two horizontal output arms of each coupler. The fiber block is epoxied using UV or heat curing epoxy or other methods as is know in the art to the PIC surface.

Of course, and as may be appreciated, there exist other methods to couple light into an opto-mechanical module and PIC including lens and other fiber geometries. Note that there are many other types of PIC geometries and configurations including PICs with active III-V wafer bonded devices on silicon substrates to create a PIC laser that is either electrically pumped or remotely optically pumped.

Such methods and techniques advantageously interoperate with structures, techniques and methods according to the present disclosure.

Figure 6:
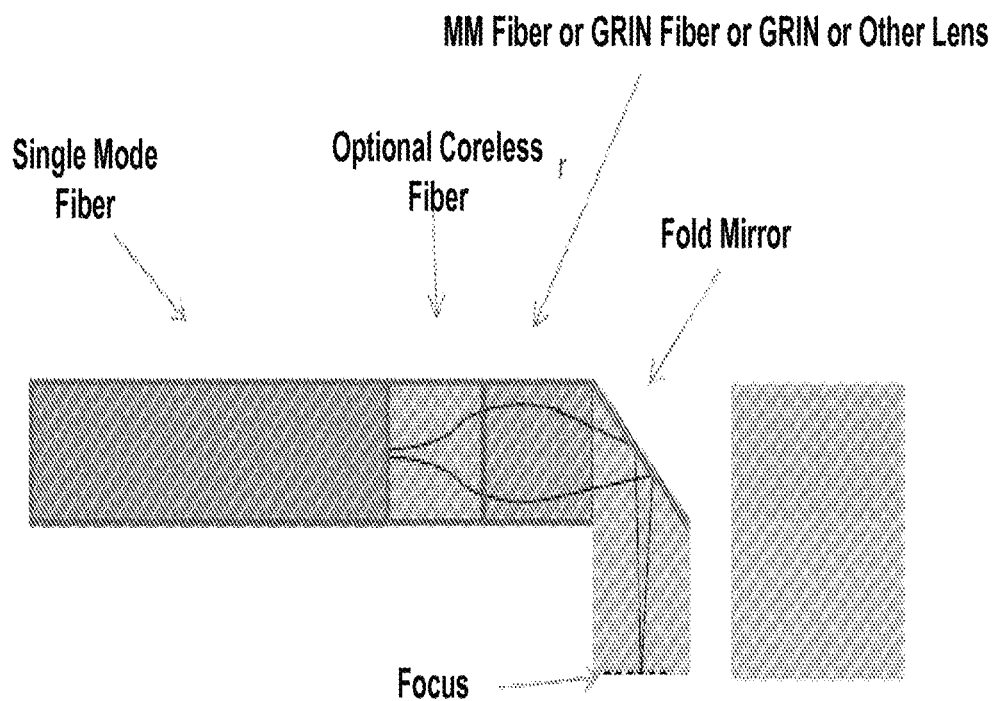
FIG. 6 show a schematic configuration of an optical fiber and lens assembly for coupling light along the axis of the fiber to a direction that is substantially away from the fiber axis according to an aspect of the present disclosure.

FIG. 6 illustrates another approach—according to the present disclosure—for coupling light to and from a PIC. In the example shown, a fiber lens is secured to the end of a single mode fiber using a combination of coreless fiber and multi-mode (MM) or graded index fiber (GRIN) and a fold mirror. The coreless fiber allows the light to expand from the single mode fiber, the MM/GRIN fiber focusing the light, and the fold mirror redirects the light substantially away from the axis of the single-mode fiber. These fibers can be individually attached to the PIC via UV glue or other suitable means or they can be assembled in a common multi fiber carrier and coupled to the PIC as a group of fibers.

Those skilled in the art will appreciate that there are a number of alternative ways—according to the present disclosure—to couple light from the single mode fiber to and from PIC waveguides including fiber "in-plane approaches" such as butt coupling to horizontal waveguides and using free space lens arrangements.

Figure 7A:
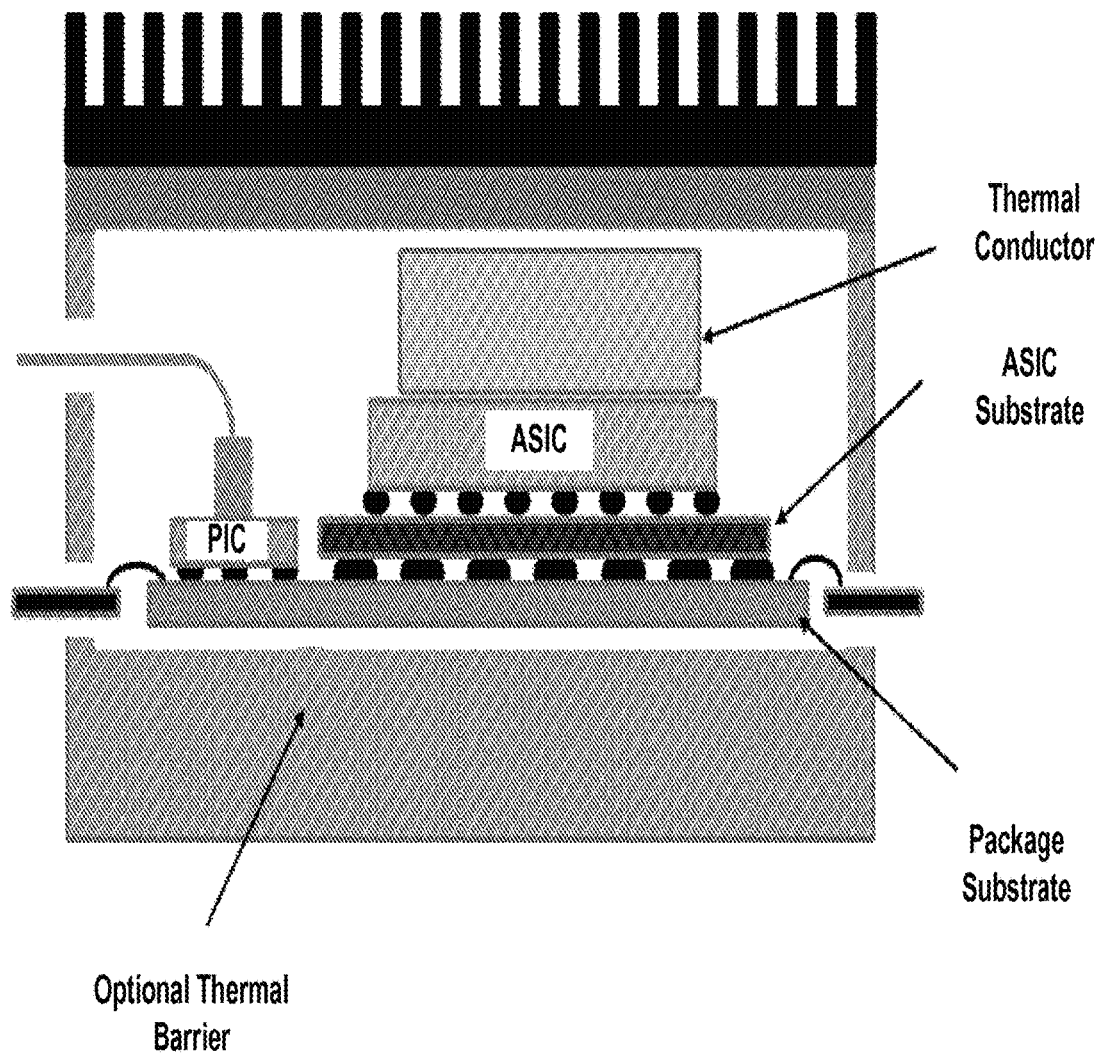
FIG. 7(A) shows a schematic configuration of co-packaging a PIC and ASIC where the ASIC is die bonded to an ASIC substrate and that structure is ball bonded to a package substrate and a PIC is also ball or die bonded to the package substrate according to an according to an aspect of the present disclosure.

FIG. 7(A) shows a cross section of one exemplary embodiment of a co-package structure according to an aspect of the present disclosure wherein a PIC and an ASIC are co-packaged. In this example, a metal or ceramic package or other suitable material is used to house the PIC and ASIC. The ASIC is preferably flip chip mounted and uses die bonds to connect to an ASIC substrate circuit board. The ASIC substrate is advantageously ball bonded to a package substrate that may be an active or passive circuit made of glass reinforced epoxy laminate (FR4), silicon, or another material.

As shown, the PIC uses a fiber butt coupling approach such as that shown and described with respect to FIG. 5. Notably, there is a small hole (opening or aperture) in the housing that allows the fiber to be inserted and then sealed. In another embodiment according to the present disclosure, the interconnect fiber may enter/exit through the lid of the ASIC as well.

To construct the device shown, the PIC is first aligned to the multi-fiber butt coupling mechanism and then aligned to the substrate circuit. Die bonds and TSVs are used to connect the PIC electrical I/O functions to the package substrate circuit. The PIC electrical I/O drivers such as the TIAs advantageously may be located on the PIC, on the substrate circuit, or on the ASIC or a mixture of the three.

Shown above the ASIC is a heat conductor which draws heat from one surface of the ASIC to an optional heat sink located on top of the ASIC lid. A high thermal impedance structure (shown schematically) is optionally located along the package bottom surface between the ASIC and the PIC to minimize the impact of the high heat dissipation and heat flow between the ASIC and the PIC. Such structure could include simply notching the metal package to minimize heat flow, or alternatively it could include heat pipes or other heat management mechanisms. Note that while only two substrate circuits (ASIC and package) are shown, one ASIC and one PIC, other embodiments have multiple ASICs, PICs, and one or more substrate circuits can be used. In yet another alternative embodiment according to the present disclosure, the ASIC substrate and the package substrate are combined into one substrate.

The package depicted in FIG. 7(A) is shown to have wire bonds from the edge of the package substrate to leads at the edge of the package. Advantageously, there are alternate approaches such as having BGA ball bonds on the bottom of the substrate circuit. In another embodiment there may exist a combination of wire bonds, die bonds, and ball bonds used to interconnect the various PIC and ASIC I/Os to the package leads. Finally, while the structure depicted in FIG. 7(A) is shown to have a cover and metal heat sink, it is not necessary to have a heat sink or cover in all applications.

Figure 7B:
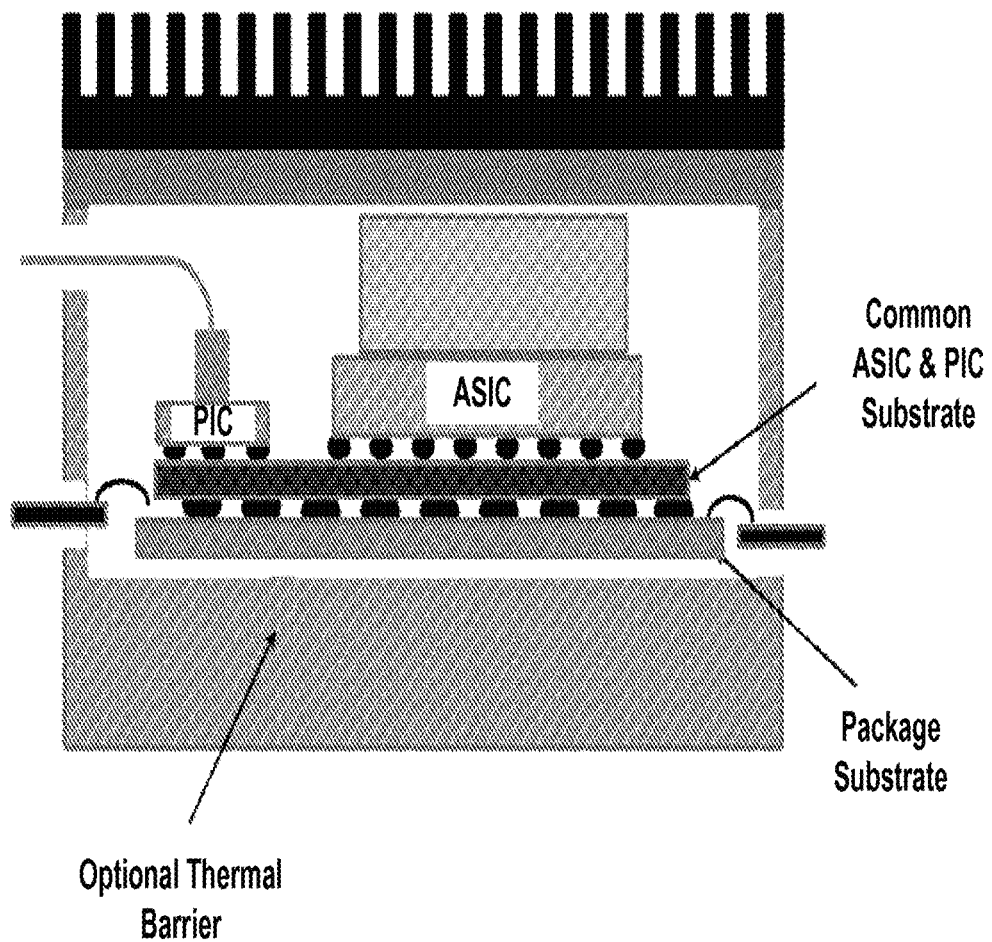
FIG. 7(B) shows a schematic configuration of co-packaging a PIC and ASIC where the PIC and ASIC are both die or ball bonded to a common ASIC/PIC substrate that is ball bonded to a package substrate according to an according to an aspect of the present disclosure.

FIG. 7(B) depicts an example of yet another exemplary embodiment according to an aspect of the present disclosure directed to the co-packaging of a PIC and ASIC where the PIC and ASIC are both die or ball bonded to a common ASIC/PIC substrate that is in-turn ball bonded to a package substrate. As shown in FIG. 7(A) the ASIC is flip chip mounted and connected to a package lid and optional external heat sink to allow heat to be drawn up and away from the ASIC.

Figure 7C:
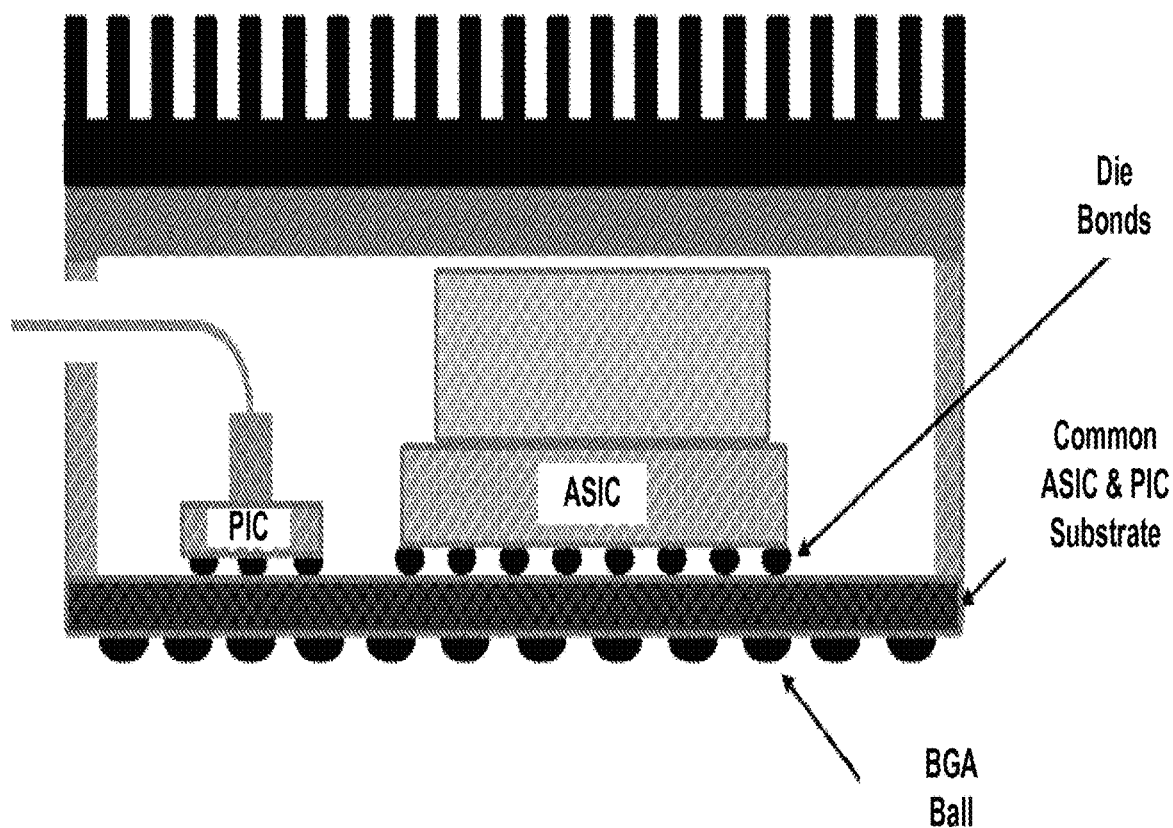
FIG. 7(C) shows a schematic configuration of co-packaging a PIC and ASIC where the PIC and ASIC are both die or ball bonded to a common ASIC/PIC substrate that has ball bonds for attaching to an external circuit board (not shown), according to an aspect of the present disclosure.

FIG. 7(C) shows yet another embodiment of an apparatus according to the present disclosure. As shown, fiber connections to the PIC are via an "out-of-plane" coupler as previously discussed. Electrical connections from various electrical PIC inputs and outputs (see, e.g. FIG. 3) are routed via TSVs to the bottom of the PIC where they connect with die bonds. The die bonds in turn connect to a common ASIC PIC substrate. Notably, both PIC and ASIC are die or ball bonded to a common ASIS/PIC substrate that has ball bonds for attaching to an external circuit board (not specifically shown). And although an "out-of-plane" coupler is shown, those skilled in the art will readily appreciate that it is possible to use "in-plane" couplers such as fiber butt coupling to horizontal waveguides with appropriate mode conversion mechanisms for efficient light coupling.

FIG. 7(C) depicts a lid and a heat sink that may be suitable for a high power dissipation ASIC. However in applications where the ASIC does not have high power dissipation, advantageously there is no need for such a lid and/or heat sink. As noted previously, a hole or other aperture may be placed in the lid/heat-sink to allow a fiber to enter/exit the package as opposed routing the fiber out of the side of the structure. Shown further in FIG. 7(C) is a block constructed from a heat conducting material such that heat is efficiently conducted from the ASIC to the heat sink.

As may be understood with reference to FIG. 7(C), in one exemplary embodiment there are no active electrical circuits on the PIC. The TIAs and/or modulator driver amplifiers are located in the common ASIC&PIC substrate or a passive ASIC&PIC substrate and the TIAs and/or modulator drivers are located on the ASIC and/or the external circuit board (not shown) that is connected via the BGAs.

Figure 8A:
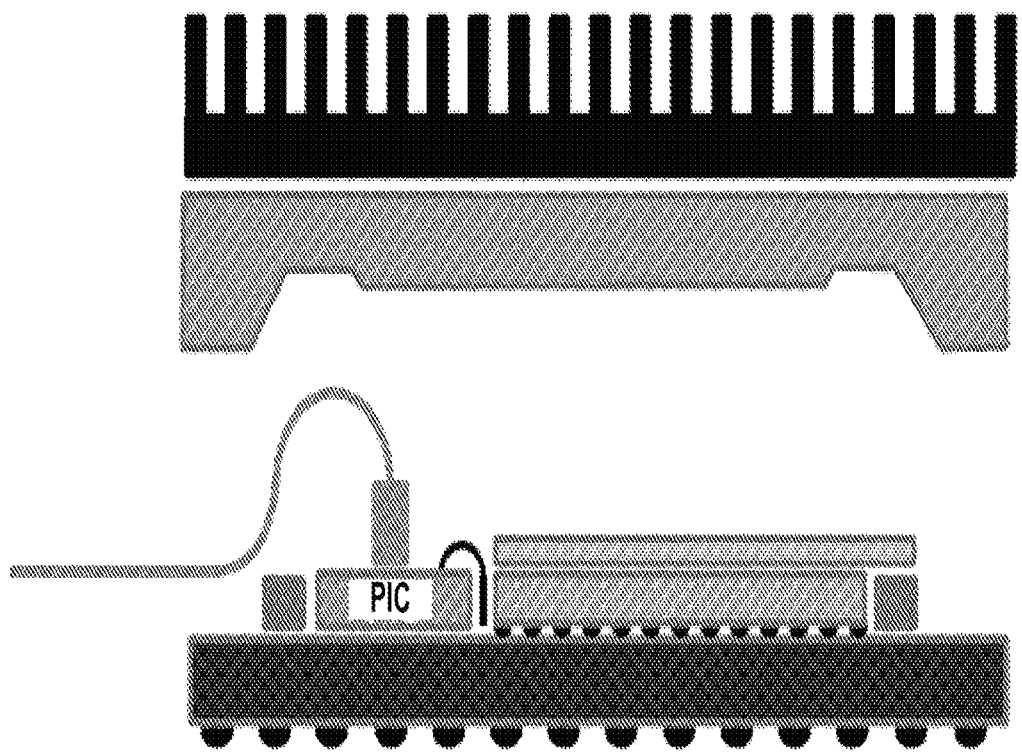
FIG. 8(A) shows a schematic configuration in which the PIC electrical connections are wire bonded to a common substrate and the ASIC is die bonded to that same substrate according to an aspect of the present disclosure.

Turning now to FIG. 8(A), there is shown—according to an aspect of the present disclosure—an embodiment of a co-packaged PIC and ASIC where the connections from the PIC are wire bonded to a passive substrate circuit that routes electrical signals to the ASIC. Advantageously, the substrate circuit may be either FR4 or silicon or other suitable material.

In the exemplary embodiment shown, ball bonds are located on the bottom of the substrate circuit. In this diagram there is a heat sink that can optionally be used and attaches to a metal lid. The metal lid is affixed to the substrate circuit using epoxy, solder, or other suitable means. In this FIG. 8(A) the lid is shown before attachment. The ASIC may be flip chip mounted and the back of the ASIC is in contact with a mechanical and thermal conductor that efficiently transfers heat from the back surface of the ASIC to the metal lid and optional heat sink.

Figure 8B:
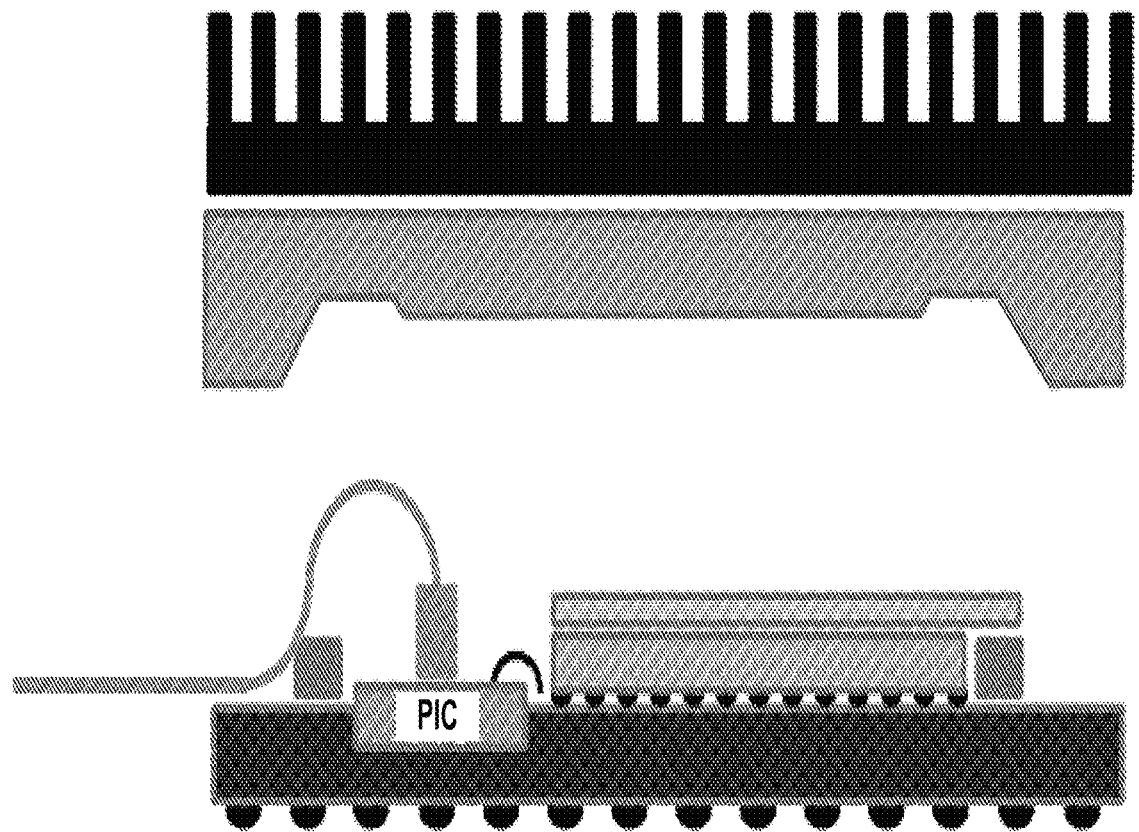
FIG. 8(B) shows a schematic configuration where the PIC electrical connections are wire bonded to a common substrate and the ASIC is die bonded to that same substrate but the PIC is recessed into the substrate to minimize wire lengths according to an aspect of the present disclosure.

FIG. 8(B) depicts an exemplary embodiment of a co-packaged PIC and ASIC where the connections from the PIC are wire bonded to a passive substrate circuit that routes electrical signals to the ASIC. The substrate circuit is recessed to minimize the distance from the PIC to the substrate circuit.

Figure 8C:
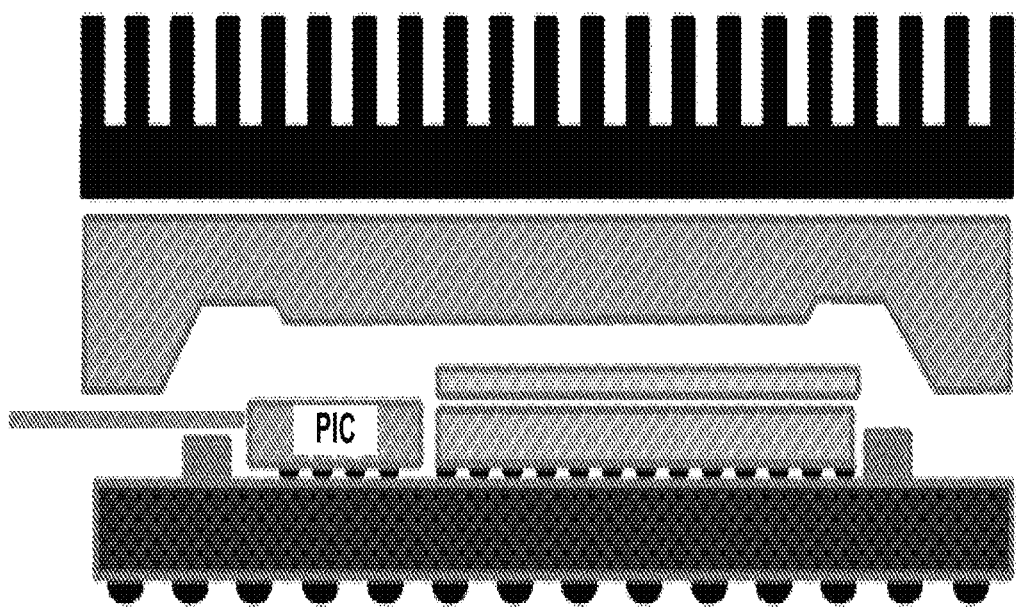
FIG. 8(C) shows a schematic configuration where the PIC electrical connections are connected via through PIC vias to a die bond that attaches to a common substrate and the ASIC is die bonded to that same substrate including a horizontal "in-place" coupling approach is shown assembly that includes a turning mirror according to an aspect of the present disclosure.

FIG. 8(C) shows an alternative embodiment of a co-packaged PIC and ASIC where the PIC has through silicon vias (TSVs) that connect the PIC electrical I/O functions to die bonds located on the bottom of the PIC. The die bonds connect to a passive or active substrate circuit. The substrate circuit also has ball bonds to allow for external connections. A horizontal "in-plane" coupling mechanism is used such as fiber butt coupling to a horizontal PIC waveguide. To accommodate the large spatial mismatch between the fiber core and the PIC waveguide, various forms of mode converters can be built into the PIC to allow for efficient coupling to and from optical fibers to the PIC. Fiber V-grooves can be used at the edge of the PIC to support the fibers.

Figure 8D:
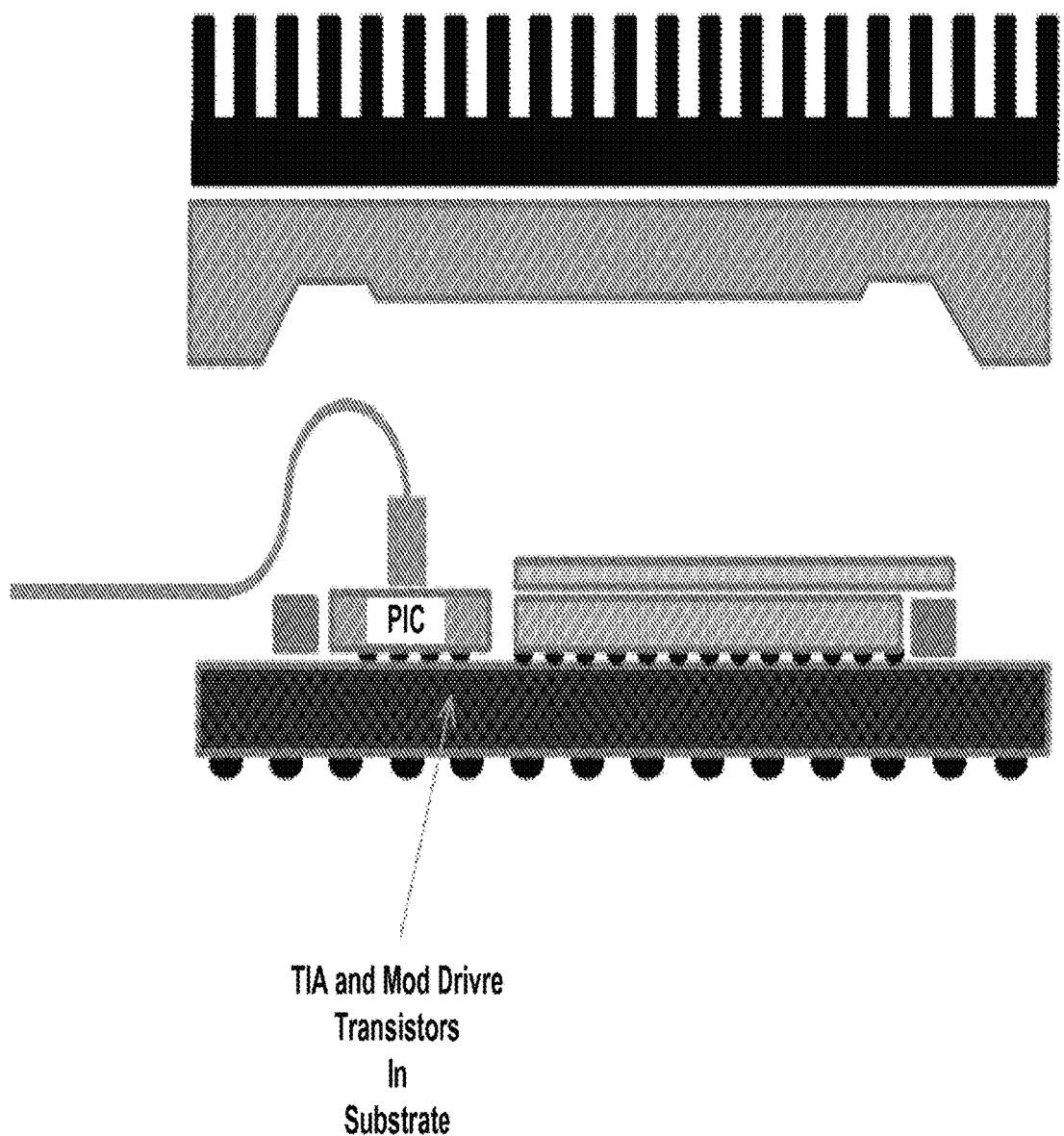
FIG. 8(D) shows a schematic configuration where the PIC electrical connections are connected via through PIC vias to a die bond that attaches to a common substrate and the ASIC is die bonded to that same substrate wherein the substrate has active electrical elements such as TIAs and modulator driver circuits according to an aspect of the present disclosure.

FIG. 8(D) shows an embodiment of a co-packaged PIC and ASIC where the PIC has through silicon vias (TSVs) that connect the PIC electrical I/O functions to die bonds located on the bottom of the PIC. The substrate circuit contains active functions such as a TIA and modulator driver. Additionally, the substrate circuit also includes ball bonds to allow for external connections. An alternative embodiment is one in which the PIC is bonded to an active CMOS circuit that is then die bonded to the substrate wherein the substrate is a passive device and the intermediate CMOS circuit is an active electrical device.

Figure 8E:
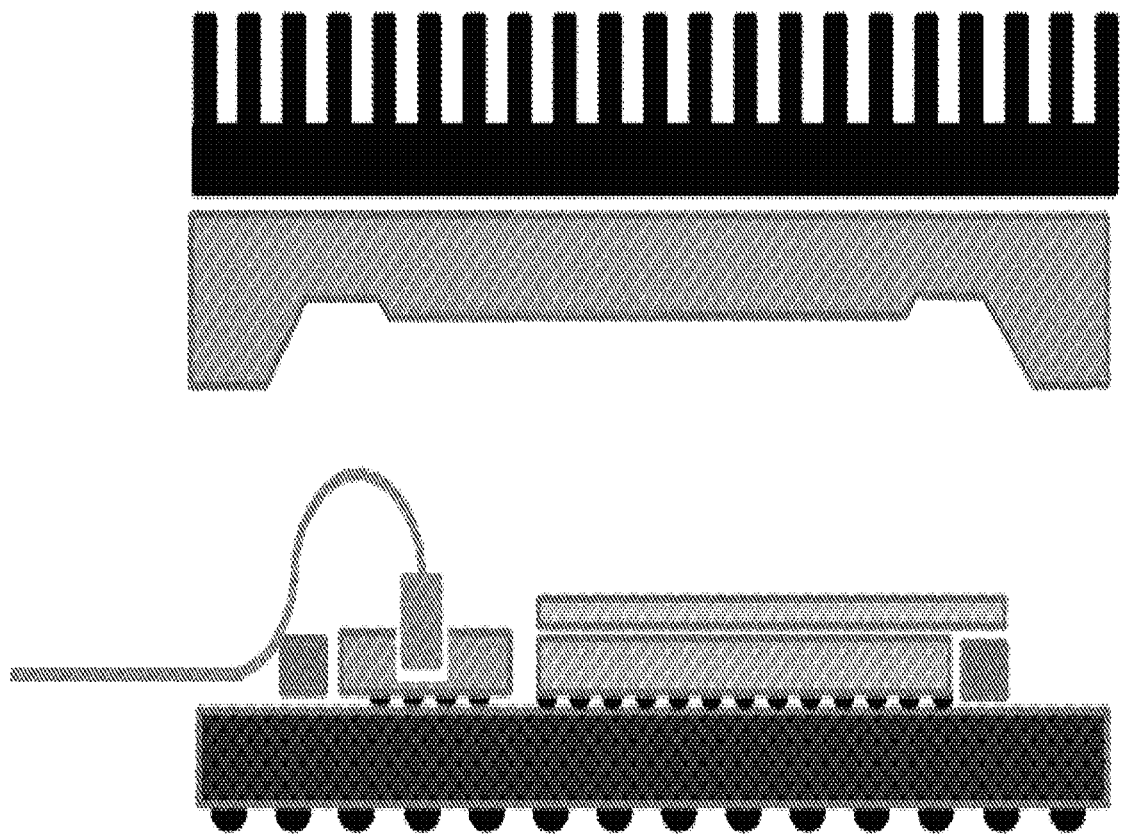
FIG. 8(E) shows a schematic configuration where the PIC is flip chip mounted and thinned to allow light from a fiber optic interface to couple to planar surface optical waveguide couplers and the PIC also has die bonds that connect to a common substrate and the ASIC is also die bonded to that same substrate according to an aspect of the present disclosure.

Turning now to FIG. 8(E) there it shows another alternative embodiment according to the present disclosure of a co-packaged PIC and ASIC where the PIC has been flip chip mounted thereby shortening the distance to the substrate circuit and contains die bonds on the surface of the PIC where there are provided electrical PIC I/O functions. The PIC has been thinned to allow backside optical interconnections. The optical coupling approach shown uses an assembly similar to that shown previously with respect to FIG. 5. Those skilled in the art will appreciate that other optical coupling approaches such as lens coupling may be used.

Figure 8F:
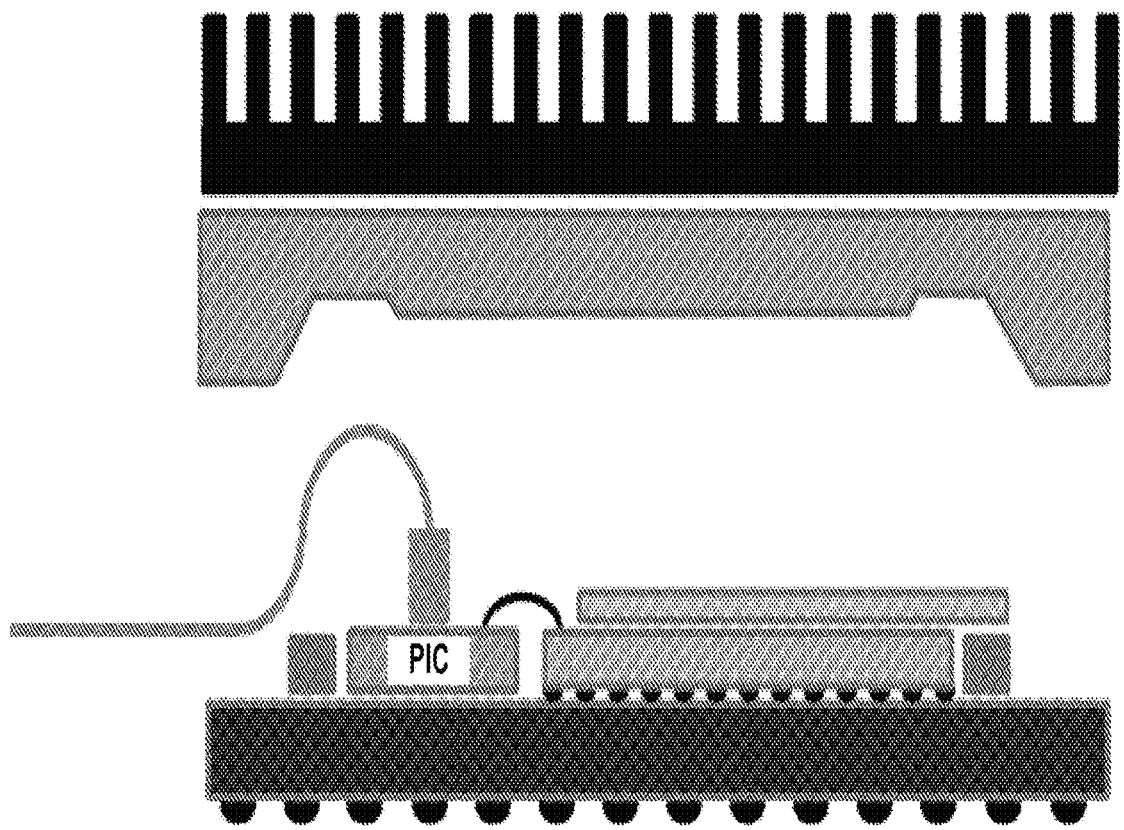
FIG. 8(F) shows a schematic configuration where the PIC is mounted on a common substrate and the distance from the PIC to an ASIC is sufficiently small to allow for wire bonding from the PIC to the ASIC wherein the ASIC may optionally include through silicon vias to connect to die bonds that are in electrical contact with the common substrate according to an aspect of the present disclosure.

FIG. 8(F) shows yet another alternative embodiment according to the present disclosure of a co-packaged PIC and ASIC wherein connections from the PIC are wire bonded directly from the PIC surface to an ASIC. Notably, high speed electrical PIC I/O functions can be optionally aligned along one edge as shown previously in FIGS. 3 and 4. Advantageously, the ASIC can be flip chip mounted in which case TSVs would be used to connect the ASIC landing pads to the active surface of the ASIC or is not flip chip mounted in which case direct connections to electrical I/O functions are made. In a preferred embodiment, heat conducting material might not be required in the non-flip chip mounted ASIC.

Figure 8G:
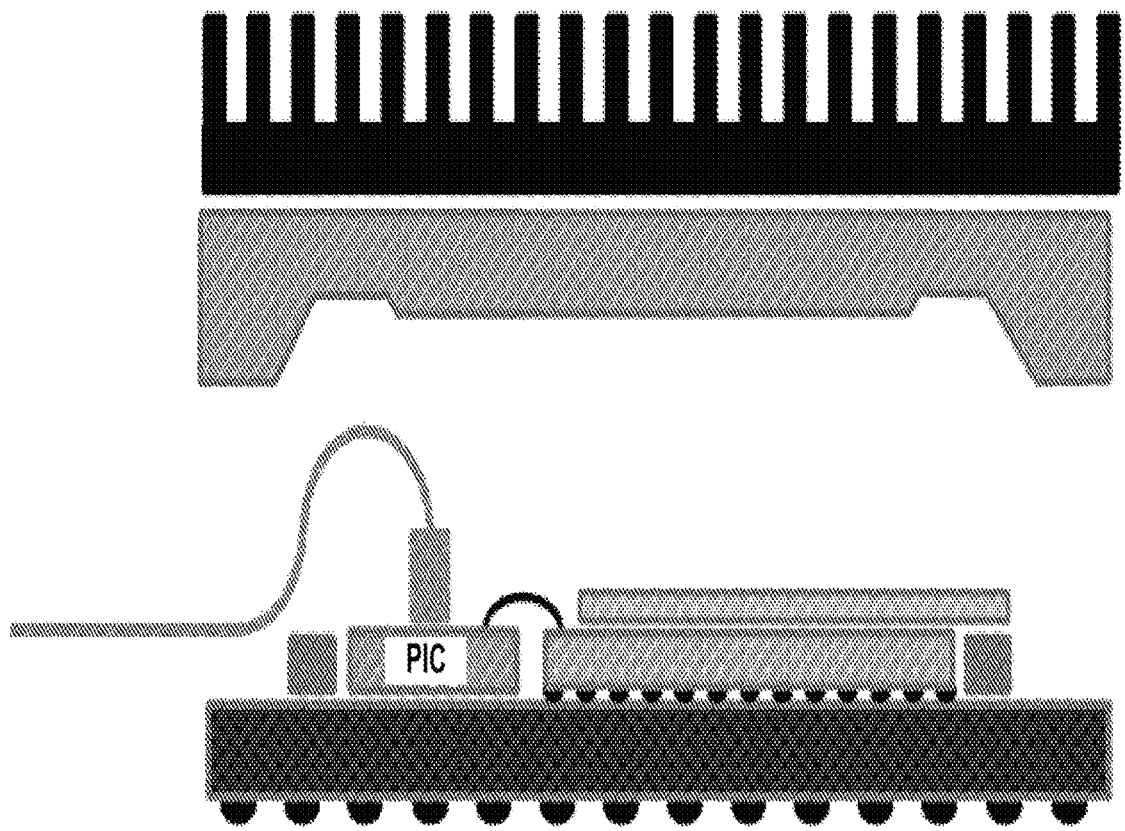
FIG. 8(G) shows a schematic configuration were the PIC is wire bonded to an intermediate ASIC that contains active or passive electronic elements wherein the intermediate ASIC is die bonded to a common substrate according to an aspect of the present disclosure.

FIG. 8(G) shows still another alternative embodiment according to an aspect of the present disclosure of a co-packaged PIC and ASIC where the connections from the PIC are wire bonded directly from the PIC surface to an intermediate circuit. This intermediate circuit may advantageously be a TIA or modulator driver. While only one intermediate circuit is shown in this figure, it is understood that more than one may be employed.

An intermediate circuit such as that shown includes TSVs that connect to die-bonds (although wire bonds are used in another embodiment) that connect to a substrate circuit. The substrate circuit routes electrical signals to the ASIC via ASIC die bonds or to the ball bonds on the bottom of the substrate to external connections (not specifically shown).

Figure 8H:
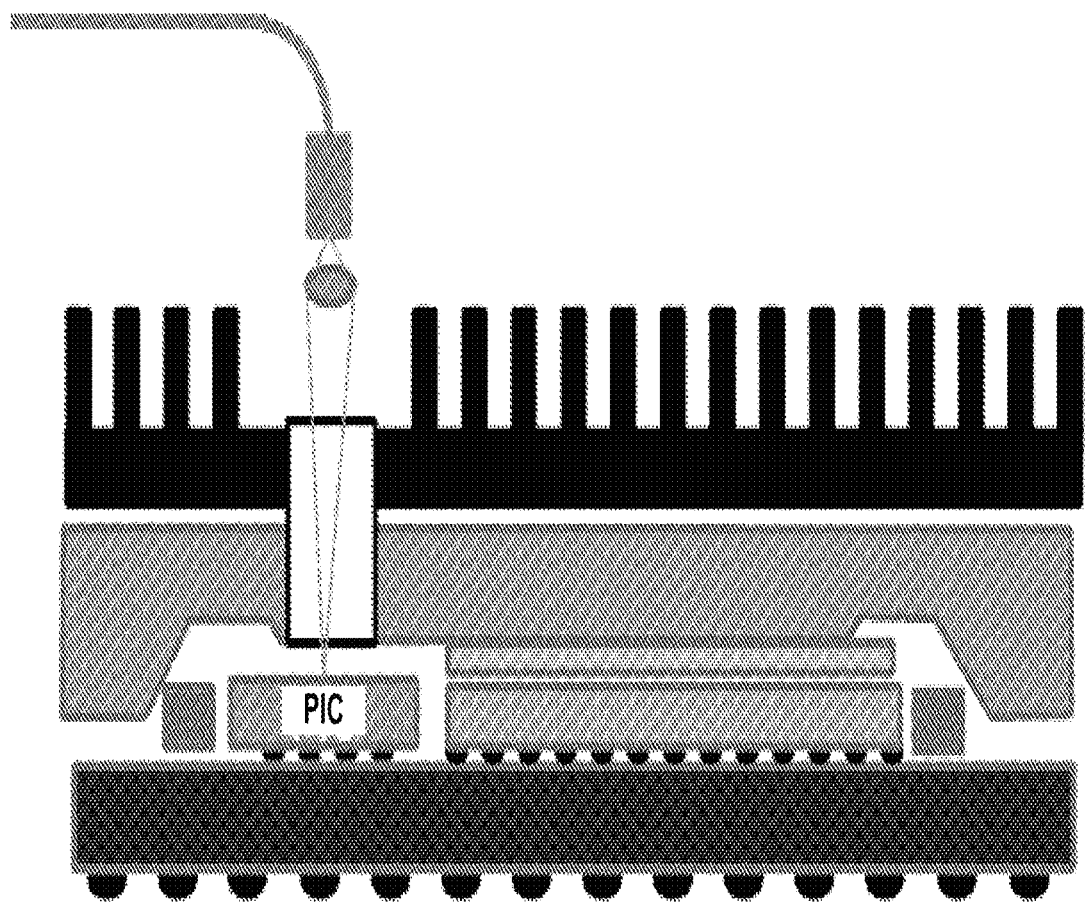
FIG. 8(H) shows a schematic configuration where a package housing contains a window and lens coupling used to couple light from a fiber to the PIC according to an aspect of the present disclosure.

With reference now to FIG. 8(H), there it shows an embodiment of a co-packaged PIC and ASIC where external optical connections are made to the PIC using a small window in the package to allow light to be transferred to and from optical fibers to the surface of the PIC. The free space to PIC light coupling can be to an "out-of-plane" coupler or an "in-plane" coupler. In this FIG. 8(H) an "out-of-plane" coupler is shown but alternatively the light could come in from the edge of the package.

Figure 9A:
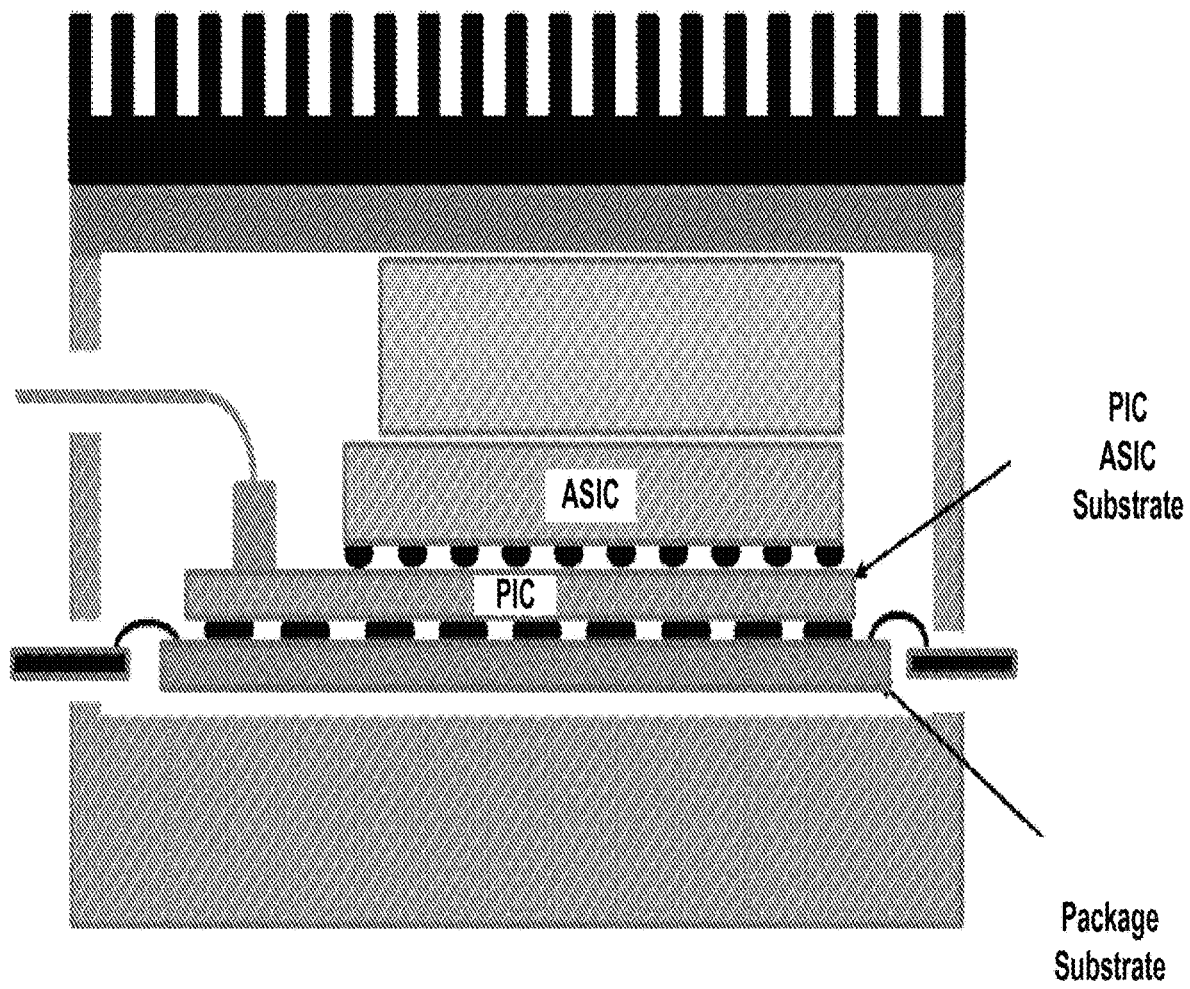
FIG. 9(A) shows a schematic configuration where the PIC serves as an ASIC substrate and the PIC is die or ball bonded to a package substrate according an aspect of the present disclosure.

FIG. 9(A) shows an embodiment of a co-packaged PIC and ASIC according to an aspect of the present disclosure where the ASIC is flip-chip mounted on the PIC using die bonds to connect to the PIC. The PIC substrate is ball bonded to a package substrate.

Advantageously, with such a package electro-optical components on the PIC can be arranged in such a way that the distance to the die bonds is minimized. Furthermore, the optical coupling components are arranged such that they are located in an area which is not covered by the ASIC. This allows to use out-of-plane couplers such as grating couplers to couple the light to and from for example an optical fiber array. Also "in-plane" coupling approaches can be used. Additionally PIC passive coupling components and the electro-optical components under the ASIC can be connected by optical waveguides.

Yet another embodiment such as that shown may position the electro-optical components such as photodetectors, lasers and modulators or a particular group away from the ASIC to avoid for example heating problems. A beneficial aspect of this approach is that high-speed connections can be maintained using either optical traces or electrical traces between the area of the fiber coupling (not under the ASIC) and the area under the ASIC. Electrical connections in the form of transmission lines could then be made on the ASIC to connect to die bonds with the ASIC.

Figure 9B:
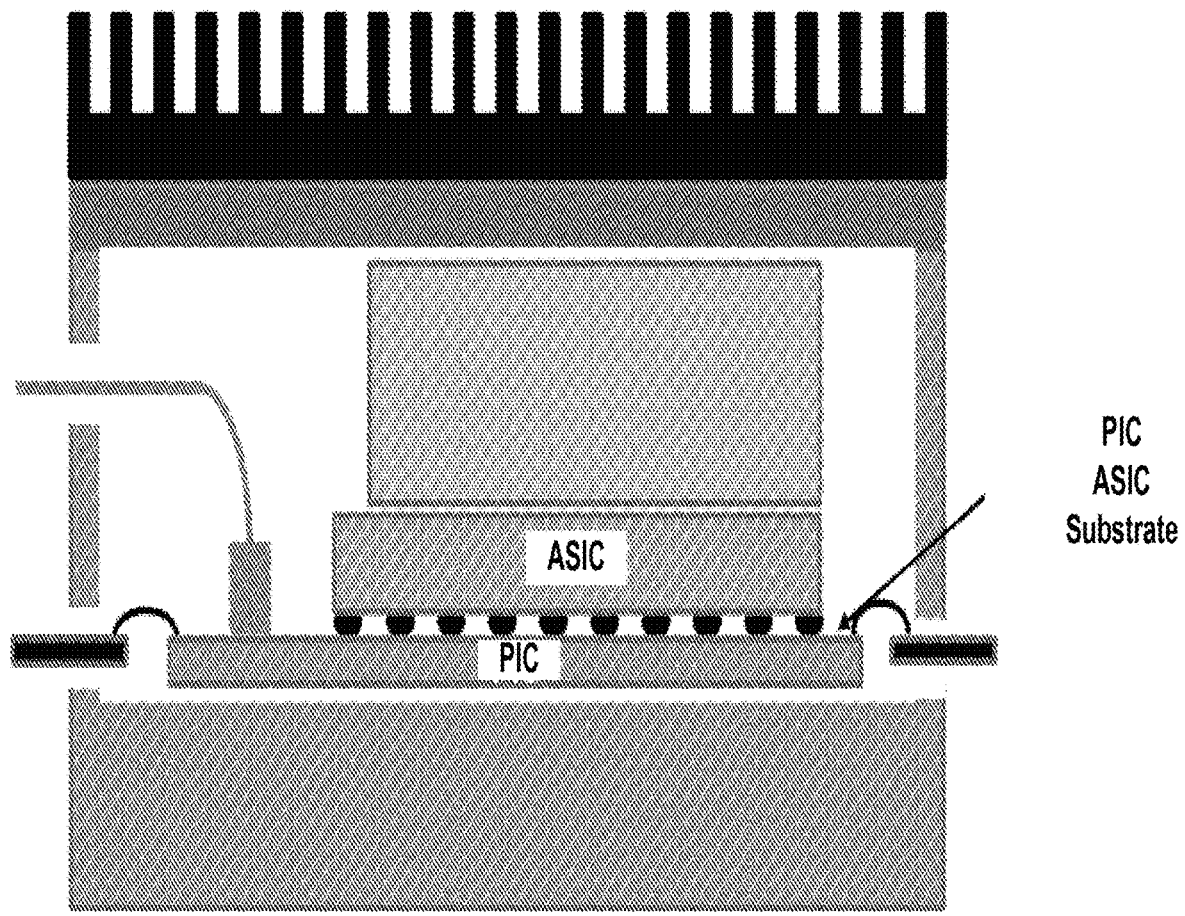
FIG. 9(B) shows a schematic configuration where the PIC serves as an ASIC substrate and the PIC is wire bonded to package leads according an aspect of the present disclosure.
Figure 9C:
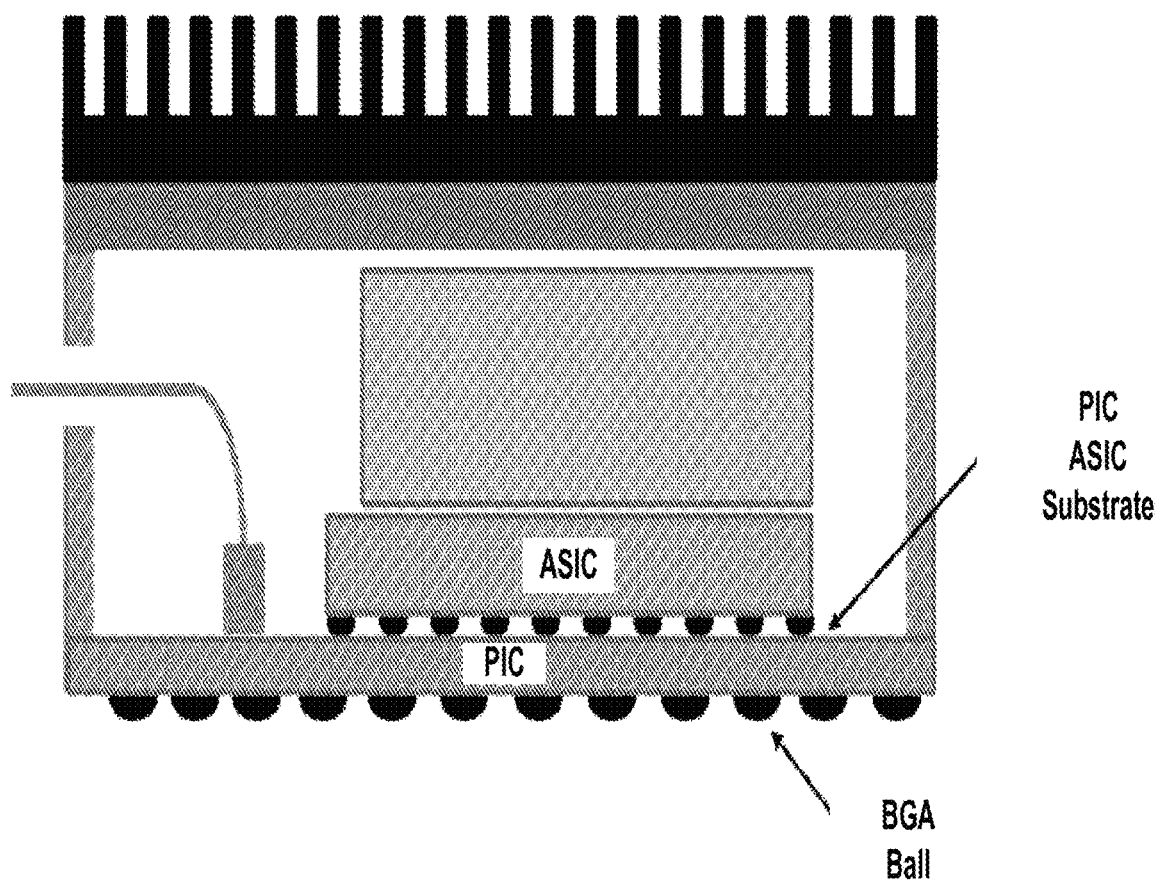
FIG. 9(C) shows a schematic configuration where the PIC serves as an ASIC substrate and the PIC has ball bonds such that the package is connected with external circuit board(s) according an aspect of the present disclosure.

FIGS. 9(B) and 9(C) show another embodiment—similar to that shown in FIG. 9(A)—wherein the PIC now serves as the packaging substrate itself. With this configuration, BGA ball bonds are preferably employed to attach to an external circuit (not shown).

Figure 9D:
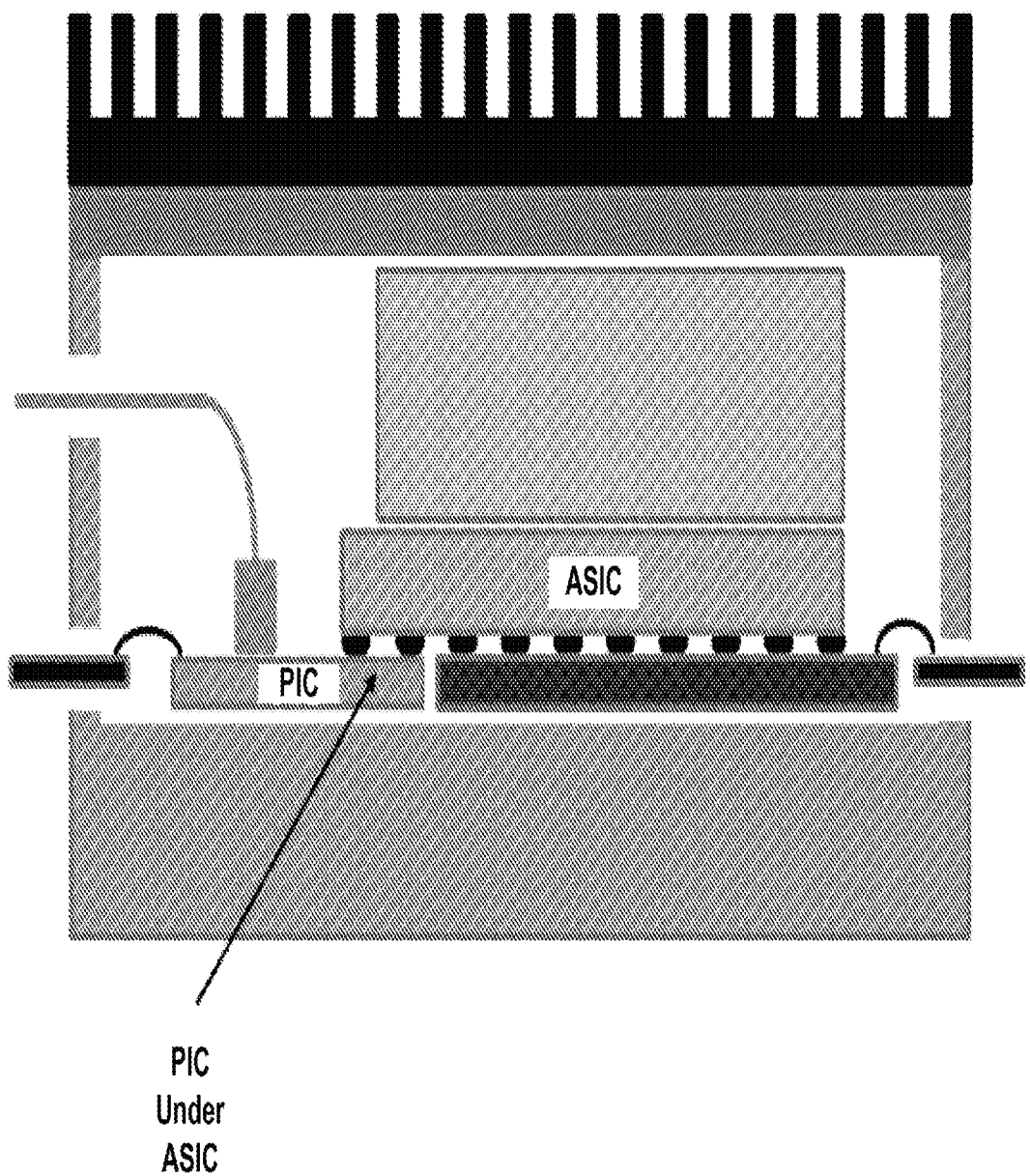
FIG. 9(D) shows a schematic configuration where the PIC partially serves as a substrate for the ASIC which is die bonded to the PIC and there is a separate substrate that is die bonded to the ASIC according an aspect of the present disclosure.

FIG. 9(D) shows an alternative embodiment according to the present disclosure wherein the ASIC is flip-chip mounted partially on the PIC using die bonds and partially on another substrate using die bumps or ball bonds. This arrangement advantageously allows to have PIC specific connections to the ASIC using the die bumps between the PIC and ASIC together with die bump connections to the main ASIC substrate. Notably, the PIC can have various shapes such that the electro-optical components are closest to the place where the corresponding ASIC parts are located.

Figure 10A:
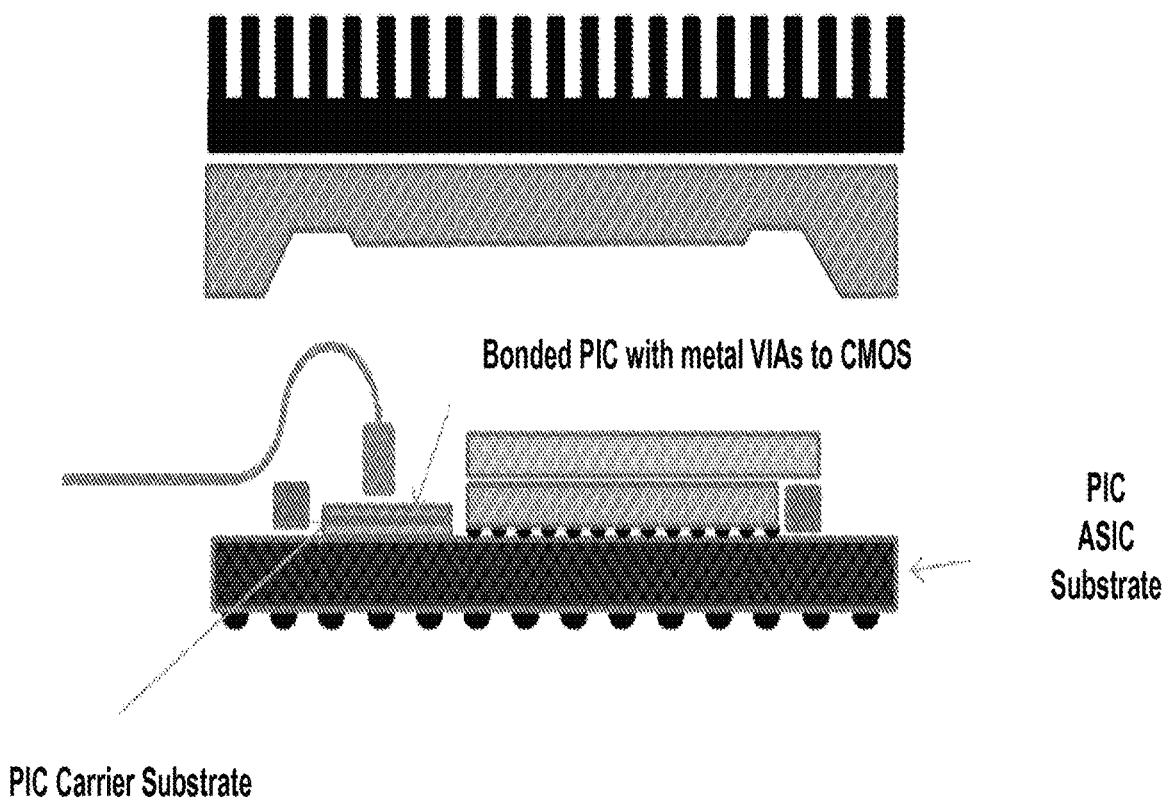
FIG. 10(A) shows a schematic configuration where the PIC has metal vias to an active CMOS substrate and the PIC and CMOS substrate are bonded together while the PIC is flip chip mounted according to an aspect of the present disclosure.

Turning now to FIG. 10(A), there it shows an embodiment in which the PIC is bonded on a PIC Carrier Substrate using a layer transfer method. As depicted, the PIC is bonded upside down on the PIC Carrier Substrate by means of polymeric bonding such as BCB bonding or using a molecular bonding approach. such bonding, the PIC is thinned by etching, polishing, or other suitable methods such that optical coupling components can be easily reached from the back of the chip or equivalently the top of the package.

Additionally, metal vias are made through the bonding agent to connect the PIC to the ASIC substrate. Using this approach there are no TSVs in the PIC which can reduce capacitance and/or other parasitic electrical effects which can reduce electrical bandwidths. The PIC Carrier Substrate may contain TSVs or other electrical interconnect techniques to connect to the package substrate. The PIC Carrier Substrate may optionally be an ASIC and contain active elements such as TIAs and Driver Amplifiers.

Figure 10B:
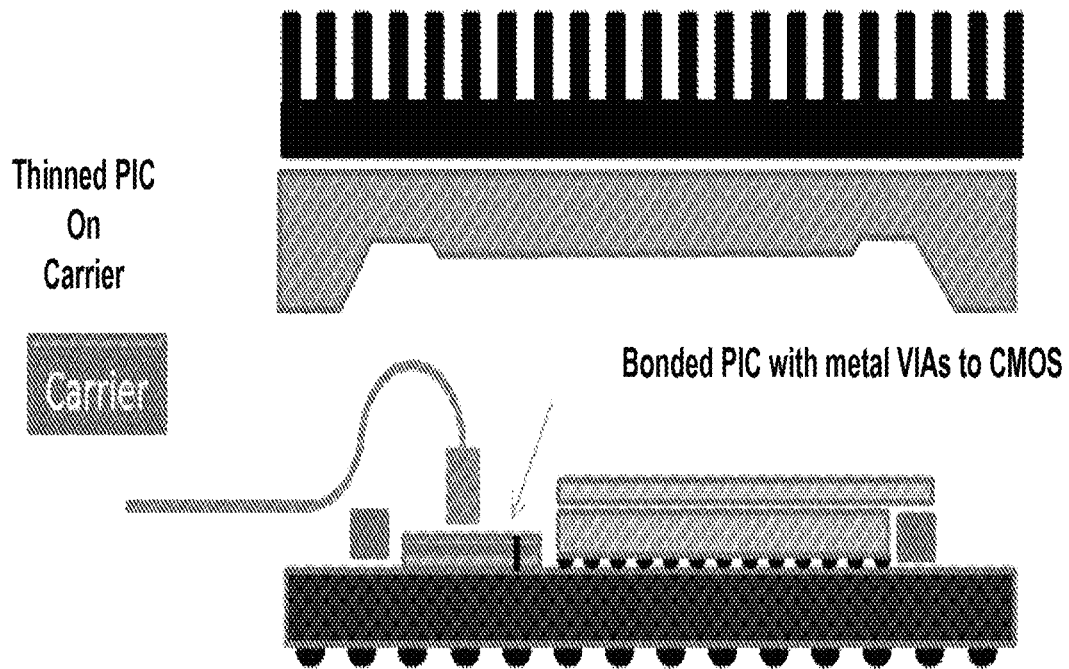
FIG. 10(B) shows a schematic configuration where the PIC is molecular or BCB bonded to an active silicon substrate circuit wherein after bonding the carrier is removed and metal vias are formed and the PIC is mounted active side up to which fiber optic connections are made according to an aspect of the present disclosure.

FIG. 10(B) is a variation on the embodiment in FIG. 10(A). In this case the PIC is first transferred on an intermediate and temporary carrier such that the PIC is upside down. In this position the PIC is thinned using etching or polishing techniques. After thinning the PIC that is transferred to the PIC Carrier Substrate and the temporary carrier is removed. In this manner the PIC will not be upside down as compared to the embodiment in FIG. 10(A).

With simultaneous reference now to FIGS. 11(A)-11(D), which show an example of a method that allows the PIC to be coupled via "out-of-plane" fiber to waveguide coupling techniques (such as to a surface grating coupler) and affixed to a carrier such that the PIC is mounted vertically. In some applications a vertically mounted PIC having a horizontally coupled fiber allow for an overall smaller package thickness. This approach is used in order to simplify the fiber subassembly, avoid low bend radius fiber and package height issues the PIC can be mounted vertically using a substrate with wrap around contact pads.

The PIC high speed signals using TSV, wire-bonding, or other technology to connect the electrical I/O points on the surface of the PIC to die bonds or other electrical pads on the bottom of the PIC. The PIC is attached to the carrier contact pads using flip chip process or other processes. The PIC subassembly is turned to the side and the carrier side contact pads attached to the high speed traces on the ASIC substrate or in another embodiment could be mounted on the ASIC directly. This attachment process places the grating couplers to the side and enables horizontal fiber attach.

Figure 11A:
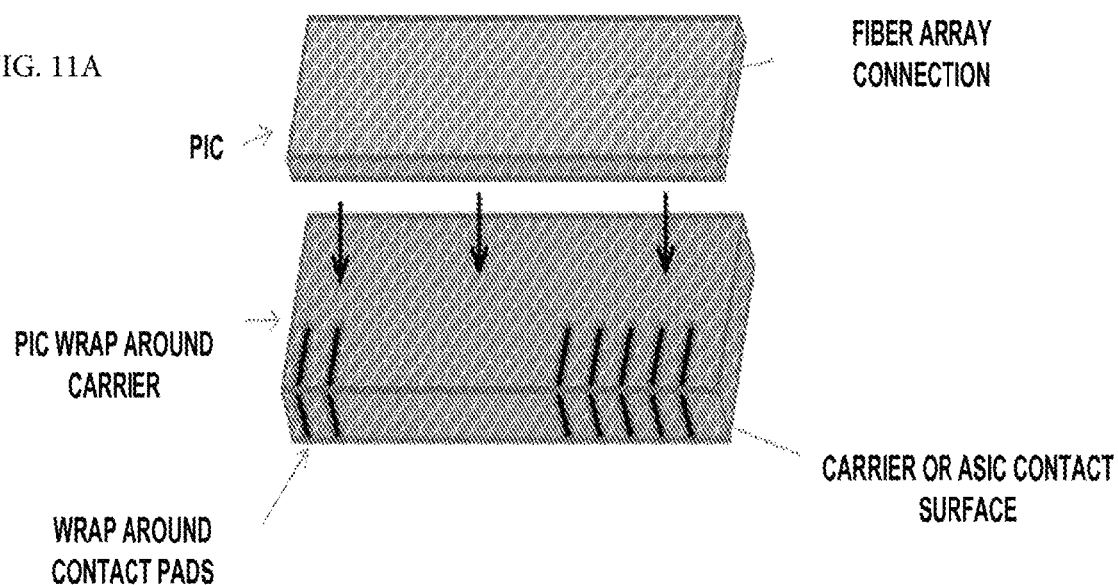
FIG. 11(A) shows a schematic configuration where the PIC contains surface grating couplers and the PIC is mounted to a wrap around electrical carrier that contains wrap around contact pads and the PIC is attached to carrier wherein the PIC is shown before PIC is attached to the wrap around carrier according to an aspect of the present disclosure.
Figure 11B:
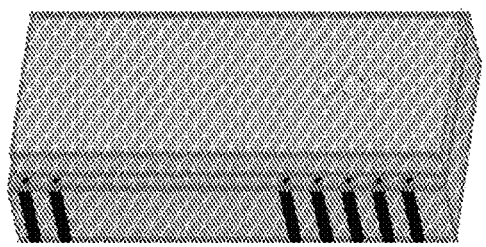
FIG. 11(B) shows a schematic configuration of the PIC attached to the wrap around carrier according to an aspect of the present disclosure.
Figure 11C:
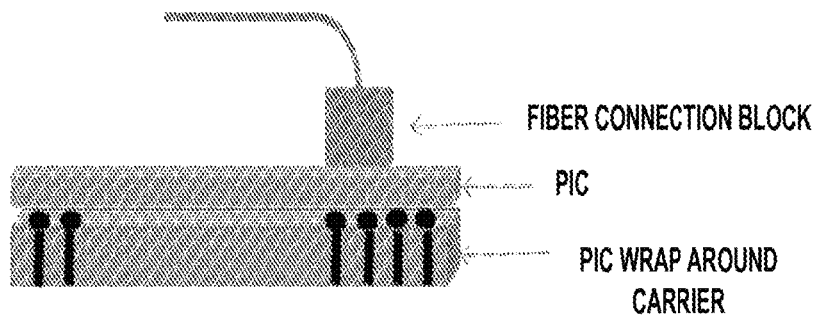
FIG. 11(C) shows a schematic configuration of a side view of the PIC fiber connection block and wrap around carrier all connected according to an aspect of the present disclosure.
Figure 11D:
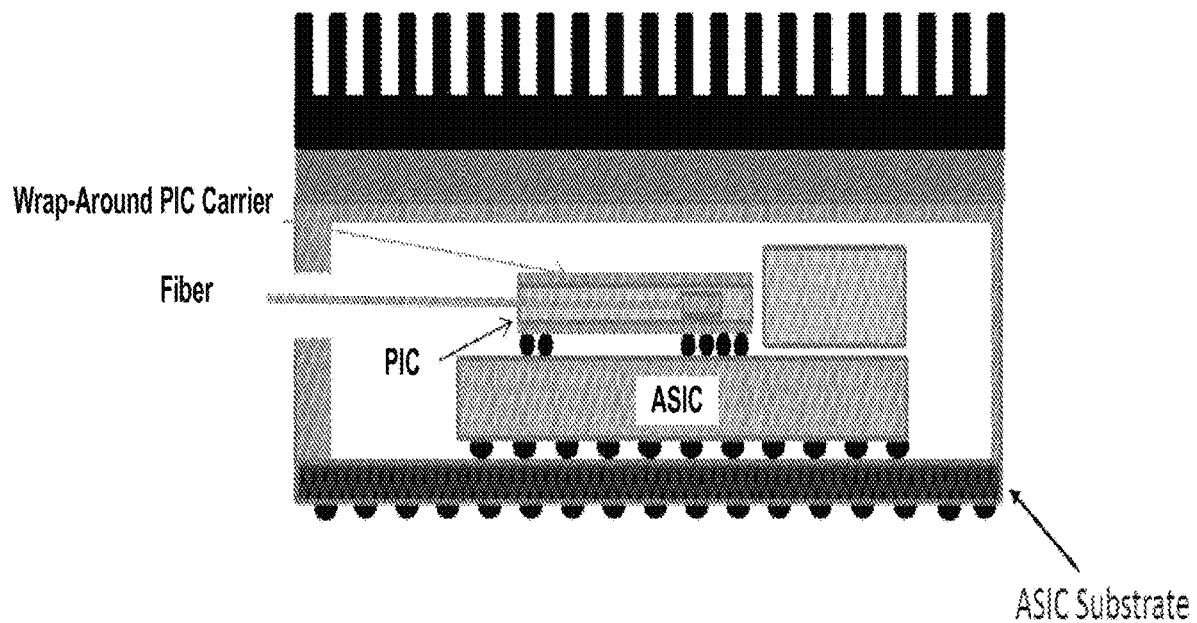
FIG. 11(D) shows a schematic configuration of the devices depicted in FIGS. 11(A), 11(B), 11(C) that contain a fiber block connected to a PIC, the PIC connected to a wrap around carrier, and the wrap around carrier attached to the ASIC according to an aspect of the present disclosure.

FIG. 11(A) shows the PIC before it is attached to the PIC wrap around electrical carrier. FIG. 11(B) shows the PIC once it is attached to the wrap around carrier. FIG. 11(C) shows a side view of the PIC fiber connection block (see, e.g, FIG. 5), connected to the PIC, and the PIC die or ball bonded or otherwise connected to the PIC wrap around carrier. Note that while TSVs to die bonds are shown in FIG. 11(C), the PIC wrap around carrier could be slightly oversized and wire bonds used from the surface of the PIC to the PIC wrap around carrier. Finally, FIG. 11(D) shows the device in FIGS. 11(A), 11(B), and 11(C) that contain a fiber block connected to a PIC, the PIC connected to a wrap around carrier, and the wrap around carrier attached directly to the ASIC. In an alternative embodiment the PIC wrap around carrier could be mounted to the ASIC substrate to allow for more of the surface of the ASIC to be free from the PIC and optionally coupled to a heat sink. Note the approach of using a PIC mounted to a PIC wrap around carrier can be used in many of the approaches shown in FIGS. 7 and 8 to minimize the thickness of the package and minimize the fiber bend radius.

Figure 12:
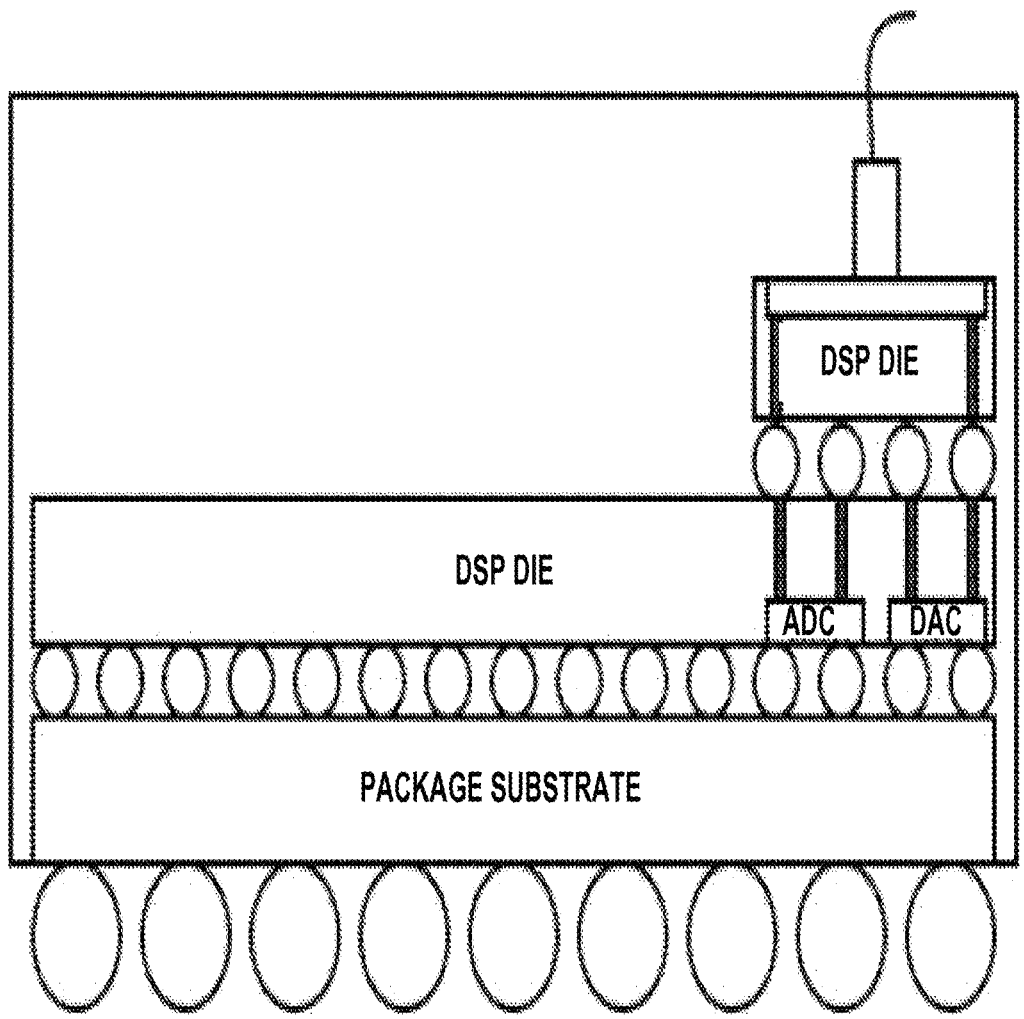
FIG. 12 shows a schematic configuration where the PIC die is die bonded to the DSP die that is die bonded to a package substrate of an example optical transponder according to an aspect of the present disclosure.

Finally, FIG. 12 shows an embodiment according to the present disclosure wherein the PIC die is die-bonded directly to an ASIC (DSP) die. The ASIC die is die bonded to a package substrate that contains ball bonds for attaching to an external circuit board (not shown). Using this approach the electrical distance from the PIC die to the ASIC to PIC I/O functions (e.g. DAC and ADC) can be minimized to allow for short high quality high speed connections.

With this description provided, those skilled in the art will readily appreciate that while the methods, techniques and structures according to the present disclosure have been described with respect to particular implementations and/or embodiments—the disclosure is not so limited. Accordingly, the scope of the disclosure should only be limited by the claims appended hereto.

The invention claimed is:

1. A co-packaging arrangement comprising:
a photonic integrated circuit (PIC) and an application specific integrated circuit (ASIC), wherein the PIC and the ASIC are disposed on a substrate within a housing;
wherein said PIC is coupled to at least two optical fibers that couple light between structures outside the housing to optical waveguides on the PIC,
wherein said PIC includes one or more optical modulators and one or more optical detectors and said substrate includes electrical interconnects for interconnecting the PIC to the ASIC; and
wherein the one or more optical modulators are driven directly from a digital-to-analog converter (DAC) that is located on the ASIC.

2. The arrangement of claim 1, wherein said PIC includes at least one surface grating coupler.

3. The arrangement of claim 1, wherein a transimpedance amplifier (TIA), electrically coupled to the one or more optical detectors, is located on the ASIC with no active electrical elements in-between the one or more optical detectors and the TIA.

4. The arrangement of claim 1, wherein the PIC includes a number of high-speed Input/Output connectors positioned along one single edge of the PIC.

5. The arrangement of claim 1, wherein the housing includes a heat sink overlying a top of the housing, wherein the housing includes an opening through which the at least two optical fibers pass.

6. The arrangement of claim 1, wherein the housing includes a window through which light is coupled to the PIC.

7. The arrangement of claim 1, wherein the ASIC is flip-chip mounted and die bonded to the substrate.

8. The arrangement of claim 1, wherein the one or more optical modulators and the one or more optical detectors form part of a coherent transceiver.

9. The arrangement of claim 1, wherein the PIC is coupled to the substrate through die bonds, and wherein the die bonds are connected to through silicon vias (TSVs) disposed within the PIC.

10. The arrangement of claim 1, wherein the PIC is edge-coupled to the at least two optical fibers.

11. The arrangement of claim 1, wherein there are no electronic amplifiers electrically connected between the one or more optical modulators and the DAC.

12. A co-packaging arrangement comprising:
a photonic integrated circuit (PIC) and an application specific integrated circuit (ASIC), wherein the PIC and the ASIC are disposed on a substrate within a housing;
wherein the PIC comprises a transceiver having one or more optical modulators driven directly from a digital-to-analog converter (DAC) that is located on the ASIC;
wherein the PIC is coupled to at least two optical fibers that couple light between structures outside the housing to optical waveguides on the PIC; and
a tunable laser disposed outside of the housing, such that there are no cooling devices within the housing.

13. The arrangement of claim 12, wherein the transceiver is a coherent transceiver.

14. The arrangement of claim 12, wherein the ASIC is disposed on the substrate beside the PIC.

15. The arrangement of claim 12, wherein the transceiver further comprises one or more optical detectors, and the ASIC comprises a transimpedance amplifier (TIA) electrically coupled to the one or more optical detectors, wherein there are no active electrical elements in-between the one or more optical detectors and the TIA.

16. The arrangement of claim 12, wherein the PIC comprises a number of high-speed Input/Output connectors positioned along one single edge of the PIC.

17. The arrangement of claim 12, wherein the housing comprises a heat sink overlying a top surface of the housing, wherein the housing includes an opening through which the at least two optical fibers pass.

18. The arrangement of claim 12, wherein the PIC is coupled to the substrate through die bonds, and wherein the die bonds are connected to through silicon vias (TSVs) disposed within the PIC.

19. The arrangement of claim 12, wherein the arrangement further comprises a v-groove assembly, wherein one of the at least two optical fibers is disposed, at least in part, on a v-groove of the v-groove assembly.

20. The arrangement of claim 12, wherein there are no electronic amplifiers electrically connected between the one or more optical modulators and the DAC.

* * * * *